(12) United States Patent
Min et al.

(10) Patent No.: US 12,527,187 B2
(45) Date of Patent: Jan. 13, 2026

(54) DISPLAY APPARATUS

(71) Applicant: Samsung Display Co., Ltd., Yongin-si (KR)

(72) Inventors: Junyoung Min, Yongin-si (KR); Soongi Kwon, Yongin-si (KR); Minwoo Byun, Yongin-si (KR); Junwon Choi, Yongin-si (KR); Junyong An, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/531,709

(22) Filed: Dec. 7, 2023

(65) Prior Publication Data

US 2024/0324348 A1    Sep. 26, 2024

(30) Foreign Application Priority Data

Mar. 24, 2023 (KR) .......... 10-2023-0039042
Apr. 26, 2023 (KR) .......... 10-2023-0054974

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0852* (2013.01); *G09G 2300/0861* (2013.01); *G09G 2310/0286* (2013.01); *G09G 2310/08* (2013.01)

(58) Field of Classification Search
CPC .............. G09G 3/3233; G09G 3/3266; G09G 2300/0426; G09G 2300/0819; G09G 2300/0852; G09G 2300/0861; G09G 2310/0286; G09G 2310/08; H10K 59/131
See application file for complete search history.

(56) References Cited

U.S. PATENT DOCUMENTS 9,887,256 B2   2/2018   Kim et al.
9,905,627 B2   2/2018   Seol et al.
(Continued)

FOREIGN PATENT DOCUMENTS

KR   10-2017-0114028   10/2017
KR   10-2020-0069436    6/2020
(Continued)

OTHER PUBLICATIONS

International Search Report corresponding to International Application No. PCT/KR2024/003577, dated Jun. 21, 2024.

*Primary Examiner* — Nelson M Rosario
(74) *Attorney, Agent, or Firm* — F. CHAU & ASSOCIATES, LLC

(57) ABSTRACT

A display apparatus includes a substrate including a display area and a peripheral area outside the display area, a power supply line arranged in the peripheral area, a gate driving circuit arranged between the power supply line and the display area and including a plurality of stages arranged in a direction, and a signal line arranged in the peripheral area, electrically connected to a first stage from among the plurality of stages of the gate driving circuit, and configured to transmit a start signal, wherein the signal line overlaps the power supply line in a plan view and is arranged between the substrate and the power supply line.

20 Claims, 11 Drawing Sheets

(56) References Cited

U.S. PATENT DOCUMENTS

| | | | |
|---|---|---|---|
| 11,094,771 B2 | 8/2021 | Cho et al. | |
| 11,295,672 B2 | 4/2022 | Na | |
| 11,355,071 B2 | 6/2022 | Kim et al. | |
| 11,756,480 B2 | 9/2023 | Jeong et al. | |
| 11,763,711 B2 | 9/2023 | Kim et al. | |
| 11,798,482 B2 * | 10/2023 | Kim | G09G 3/3266 |
| 2021/0193040 A1 * | 6/2021 | Na | G09G 3/3266 |

FOREIGN PATENT DOCUMENTS

| | | |
|---|---|---|
| KR | 10-2021-0081507 | 7/2021 |
| KR | 10-2021-0127283 | 10/2021 |
| KR | 10-2366568 | 2/2022 |
| KR | 10-2022-0050117 | 4/2022 |
| KR | 10-2022-0087190 | 6/2022 |
| KR | 10-2023-0034469 | 3/2023 |

* cited by examiner

DISPLAY APPARATUS

CROSS-REFERENCE TO RELATED APPLICATIONS

This application is based on and claims priority under 35 U.S.C. § 119 to Korean Patent Application Nos. 10-2023-0039042, filed on Mar. 24, 2023, and 10-2023-0054974, filed on Apr. 26, 2023, in the Korean Intellectual Property Office, the disclosures of which are incorporated by reference herein in their entireties.

BACKGROUND

1. Technical Field

One or more embodiments relate to a display apparatus.

2. Description of the Related Art

Display apparatuses visually display data. Display apparatuses may be used as displays of small-sized products such as mobile phones or large products such as televisions.

A display apparatus includes sub-pixels emitting light by receiving electrical signals to externally display images. Each sub-pixel includes a display element, and for example, an organic light-emitting display apparatus includes organic light-emitting diodes (OLEDs) as display elements. In general, an organic light-emitting display apparatus operates as thin film transistors and OLEDs are formed on a substrate and the OLEDs emit light by themselves.

Recently, as the use of display apparatuses has diversified, various designs have been made to improve the quality of display apparatuses.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The technical objectives to be achieved by the disclosure are not limited to those described herein, and other technical objectives that are not mentioned herein would be clearly understood by a person skilled in the art from the description of the disclosure.

One or more embodiments include a display apparatus in which a dead space is improved. However, this is merely an example, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus includes a display area and a peripheral area outside the display area, a power supply line arranged in the peripheral area, a gate driving circuit arranged between the power supply line and the display area and including a plurality of stages arranged in a direction, and a signal line arranged in the peripheral area, electrically connected to a first stage from among the plurality of stages of the gate driving circuit, and configured to transmit a start signal, wherein the signal line overlaps the power supply line in a plan view and may be arranged between a substrate and the power supply line.

The plurality of stages may be configured to sequentially output gate signals based on the start signal or an output signal of a previous stage.

The display apparatus may further include a light-emitting diode arranged in the display area, a sub-pixel circuit arranged between the substrate and the light-emitting diode, wherein the sub-pixel circuit includes a transistor including a semiconductor layer and a gate electrode disposed above the semiconductor layer and overlapping at least a portion of the semiconductor layer in a plan view, and a capacitor including a first electrode and a second electrode disposed under the first electrode and overlapping the first electrode in a plan view.

The display apparatus may further a connection electrode electrically connecting the light-emitting diode to the sub-pixel circuit, wherein the power supply line and the connection electrode may include a same material.

The signal line and the gate electrode may include a same material.

The transistor may further include a lower gate electrode arranged between the substrate and the semiconductor layer and overlapping the gate electrode in a plan view.

The signal line and the lower gate electrode may include a same material.

The capacitor may further include a third electrode disposed under the second electrode and overlapping the first electrode and the second electrode in a plan view, the first electrode may be electrically connected to the third electrode, and the second electrode and the lower gate electrode may include a same material.

The semiconductor layer may include an oxide semiconductor.

The light-emitting diode may include a sub-pixel electrode and an opposite electrode, and the power supply line may be configured to supply a common voltage to the opposite electrode.

The display apparatus may further include a plurality of sub-pixels arranged in the display area, wherein each of the plurality of sub-pixels includes a first transistor including a first terminal, a second terminal, a first gate electrode, and a second gate electrode electrically connected to the second terminal, a second transistor electrically connected to the first gate electrode of the first transistor and a data line, a third transistor electrically connected to the first gate electrode of the first transistor and a first voltage line, a fourth transistor electrically connected to the second terminal of the first transistor and a second voltage line, a fifth transistor electrically connected to the second terminal of the first transistor and a third voltage line, a first capacitor including a first electrode electrically connected to the first gate electrode of the first transistor and a second electrode electrically connected to the second terminal of the first transistor, and a second capacitor including a first electrode electrically connected to the third voltage line and a second electrode electrically connected to the second terminal of the first transistor.

The display apparatus may further include a sixth transistor electrically connected to the second terminal of the first transistor and a light-emitting diode, and a seventh transistor electrically connected to the light-emitting diode and a fourth voltage line.

According to one or more embodiments, a display apparatus includes a substrate including a display area and a peripheral area outside the display area, a power supply line arranged in the peripheral area and extending in a first direction, a plurality of gate driving circuits arranged between the power supply line and the display area and each including a plurality of stages arranged in the first direction, and a plurality of signal lines arranged in the peripheral area, electrically connected to a first stage from among the plurality of stages of each of the plurality of gate driving circuits, and configured to transmit start signals, wherein the plurality of signal lines overlap the power supply line in a plan view and may be arranged between the substrate and the power supply line.

The plurality of stages may be configured to sequentially output gate signals based on the start signal or an output signal of a previous stage.

The display apparatus may further include a light-emitting diode arranged in the display area, and a sub-pixel circuit arranged between the substrate and the light-emitting diode, wherein the sub-pixel circuit may include a transistor including a semiconductor layer and a gate electrode disposed above the semiconductor layer and overlapping at least a portion of the semiconductor layer in a plan view, and a capacitor including a first electrode and a second electrode disposed under the first electrode and overlapping the first electrode in a plan view.

The display apparatus may further include a connection electrode electrically connecting the light-emitting diode to the sub-pixel circuit, wherein the power supply line and the connection electrode may include a same material.

The plurality of signal lines and the gate electrode may include a same material.

The transistor may further include a lower gate electrode arranged between the substrate and the semiconductor layer and overlapping the gate electrode in a plan view.

The plurality of signal lines and the lower gate electrode may include a same material.

The capacitor may further include a third electrode disposed under the second electrode and overlapping the first electrode and the second electrode in a plan view, the first electrode may be electrically connected to the third electrode, and the second electrode and the lower gate electrode may include a same material.

BRIEF DESCRIPTION OF THE DRAWINGS

The above and other aspects of the disclosure will be more apparent by describing in detail embodiments thereof with reference to the attached drawings, in which.

DETAILED DESCRIPTION OF THE EMBODIMENTS

Figure 1A:
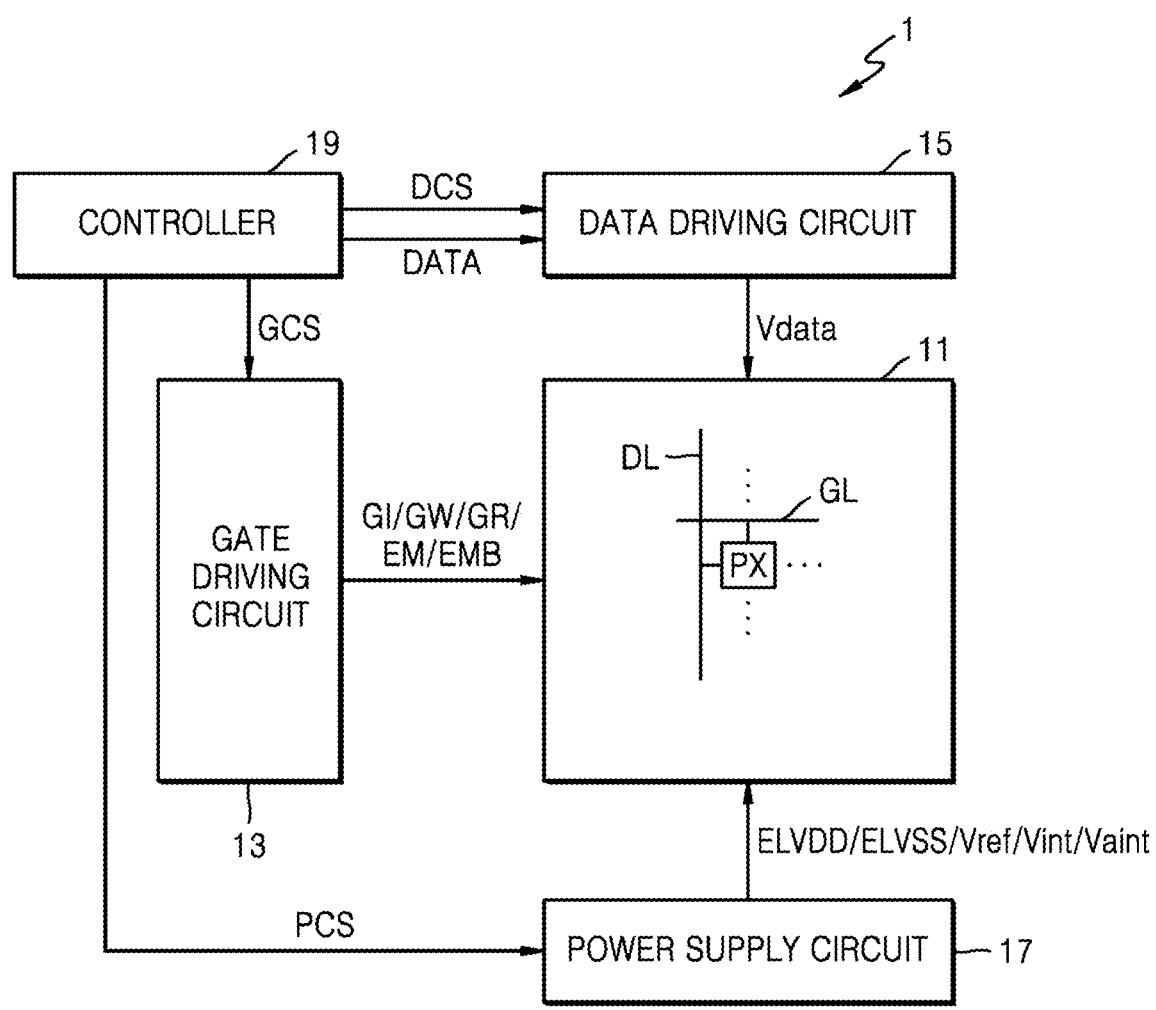
FIGS. 1A and 1B are schematic diagrams of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like reference numbers and/or reference characters refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another. For example, a first element may be referred to as a second element, and similarly, a second element may be referred to as a first element without departing from the scope of the disclosure.

As used herein, the singular forms "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element (or a layer, a region, a portion, or the like) is referred to as "formed on", "being on", "disposed on", "connected to" or "coupled to" another element in the specification, it can be directly formed on, disposed on, connected or coupled to another element mentioned above, or intervening elements may be disposed therebetween. It will be understood that the terms "connected to" or "coupled to" may include a physical or electrical connection or coupling.

In embodiments below, when an element such as a wire is referred to as "extending in a first direction or a second direction," the element may extend in a straight line, may extend in a zigzag form, or may extend in a curve, or any combination thereof, in the first direction or the second direction.

The phrase "in a plan view" means viewing the object from the top, and the phrase "in a schematic cross-sectional view" means viewing a cross-section of which the object is vertically cut from the side. Hence, the expression "in a plan view" used herein may mean that an object is viewed in the third z direction from the top. The phrase "in a schematic cross-sectional view" means viewing a cross-section in the first x direction or the second y direction of which the object is vertically cut from the side. The third z direction also can be referred to as a "thickness direction".

The terms "overlap", "overlapping", or "overlapped" mean that a first object may be above or below or to a side of a second object, and vice versa. The term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In case that an element is referred to as being "in contact" or "contacted" or the like to another element, the element may be in "electrical contact" or in "physical contact" with another element; or in "indirect contact" or in "direct contact" with another element.

A description that a component is "configured to" perform a specified operation may be defined as a case where the component is constructed and arranged with structural features that can cause the component to perform the specified operation.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

Hereinafter, one or more embodiments of the disclosure will be described in detail with reference to the accompanying drawings, and like elements in the drawings denote like elements.

Figure 1B:
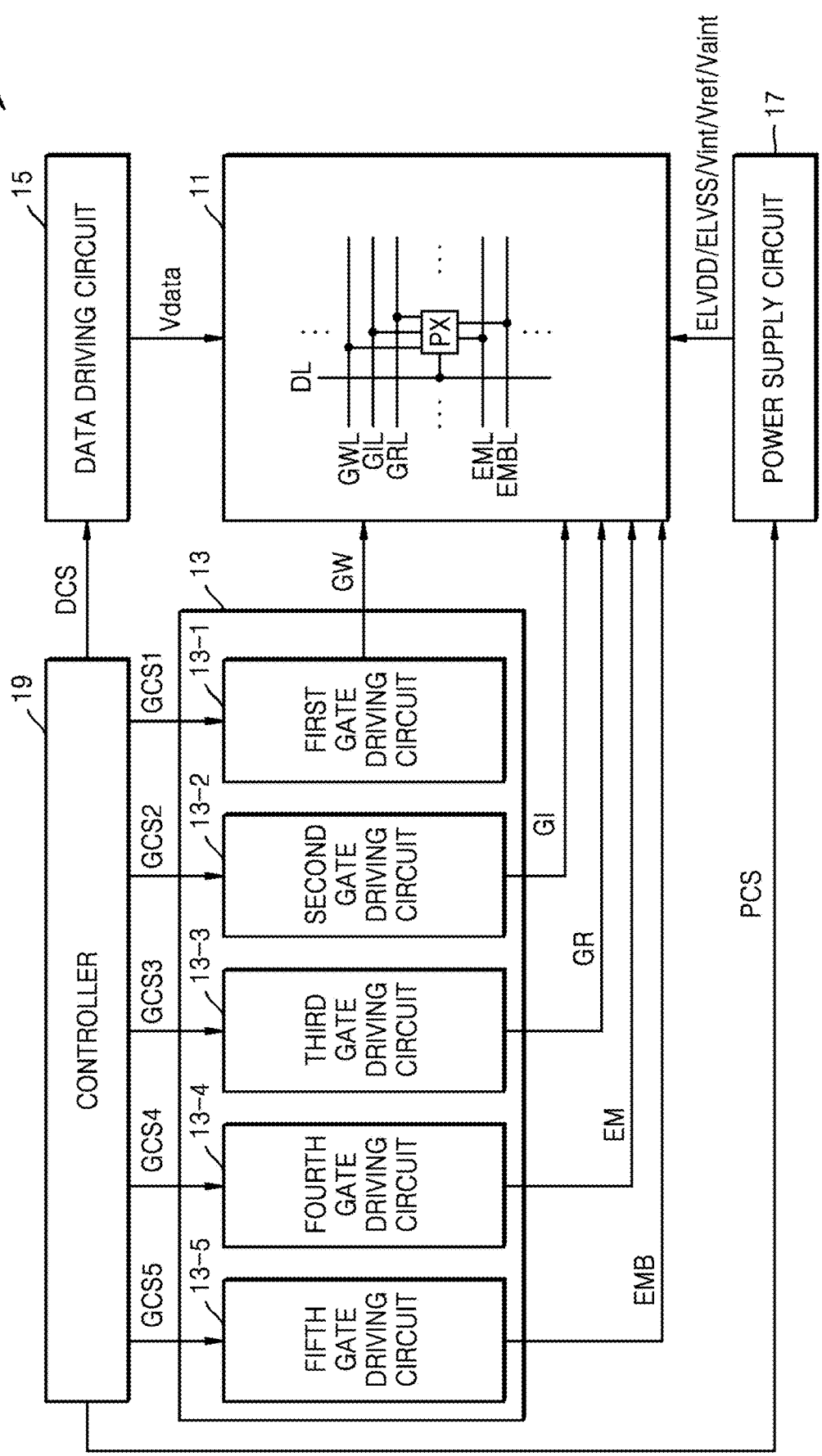

FIGS. 1A and 1B are schematic diagrams of a display apparatus according to an embodiment.

Referring to FIGS. 1A and 1B, a display apparatus 1 may include a pixel portion 11, a gate driving circuit 13, a data driving circuit 15, a power supply circuit 17, and a controller 19.

In the pixel portion 11, sub-pixels PX may be arranged. The sub-pixels PX may be arranged in various forms, such as a stripe form, a PenTile® form, a diamond form, a mosaic form, or a combination thereof, thus implementing images. The pixel portion 11 may be arranged in a display area (DA of FIG. 2) of a substrate (100 of FIG. 2). Each sub-pixel PX may include a light-emitting diode. For example, the light-emitting diode may be an organic light-emitting diode. The light-emitting diode may be electrically connected to a sub-pixel circuit. Each sub-pixel PX may emit, for example, red light, green light, blue light, or white light by using the light-emitting diodes.

In the pixel portion 11, signal lines configured to apply electrical signals to the sub-pixels PX may be arranged. In the pixel portion 11, gate lines GL may be spaced apart from each other at regular intervals in a second y direction (e.g., a column direction) and arranged. The gate lines GL may each extend in a first x direction (e.g., a row direction) and may be electrically connected to the sub-pixels PX located in the same row (a row line). In the pixel portion 11, data lines DL may be spaced apart from each other at regular intervals in the x direction and arranged. The data lines DL may each extend in the y direction and may be electrically connected to the sub-pixels PX located in the same column (a column line).

The gate driving circuit 13 may be electrically connected to the gate lines GL; the gate driving circuit 13 also may be configured to generate gate signals in response to a control signal GCS from the controller 19; the gate driving circuit 13 also may sequentially output the gate signals to the gate lines GL. The gate line GL may be electrically connected to a gate of a transistor included in the sub-pixel PX. The gate signal may be a gate control signal configured to control turning on and off of a transistor of which a gate electrode is electrically connected to the gate line GL. The gate signal may be a square wave signal including an on voltage, at which a transistor may be turned on, and an off voltage, at which the transistor may be turned off. In an embodiment, the on voltage may be a low-level voltage or a high-level voltage. In case that the gate signal has the on voltage, a transistor of the sub-pixel PX electrically connected to the gate line GL may be turned on. A duration in which the on voltage of the gate signal is maintained is referred to as on time.

Referring to FIG. 1B, the gate driving circuit 13 may include gate driving circuits. For example, the gate driving circuit 13 may include a first gate driving circuit 13-1, a second gate driving circuit 13-2, a third gate driving circuit 13-3, a fourth gate driving circuit 13-4, and a fifth gate driving circuit 13-5. In some cases, some gate driving circuits may be integrated.

The gate lines GL may include first gate lines GWL electrically connected to the first gate driving circuit 13-1, second gate lines GIL electrically connected to the second gate driving circuit 13-2, third gate lines GRL electrically connected to the third gate driving circuit 13-3, fourth gate lines EML electrically connected to the fourth gate driving circuit 13-4, and fifth gate lines EMBL electrically connected to the fifth gate driving circuit 13-5.

The first gate driving circuit 13-1 may be electrically connected to the first gate lines GWL and configured to sequentially supply first gate signals GW to the first gate lines GWL according to a first control signal GCS1. The second gate driving circuit 13-2 may be electrically connected to the second gate lines GIL and configured to sequentially supply second gate signals GI to the second gate lines GIL according to a second control signal GCS2. The third gate driving circuit 13-3 may be electrically connected to the third gate lines GRL and configured to sequentially supply third gate signals GR to the third gate lines GRL according to a third control signal GCS3. The fourth gate driving circuit 13-4 may be electrically connected to the fourth gate lines EML and configured to sequentially supply fourth gate signals EM to the fourth gate lines EML according to a fourth control signal GCS4. The fifth gate driving circuit 13-5 may be electrically connected to the fifth gate lines EMBL and configured to sequentially supply fifth gate signals EMB to the fifth gate lines EMBL according to a fifth control signal GCS5.

Referring to FIGS. 1A and 1B, the data driving circuit 15 may be electrically connected to the data lines DL and configured to apply a data signal Vdata, which indicates a gradation, to the data lines DL according to a sixth control signal DCS. The data driving circuit 15 may convert input image data DATA, which includes the gradation that is input from the controller 19, into the data signal Vdata in the form of voltages or currents.

The power supply circuit 17 may generate voltages required for the operations of the sub-pixels PX, according to a seventh control signal PCS. For example, the power supply circuit 17 may generate a driving voltage ELVDD and a common voltage ELVSS and supply the same to the sub-pixels PX. The driving voltage ELVDD may be a high-level voltage supplied to a sub-pixel electrode (or an anode) of a light-emitting diode included in the sub-pixel PX. The common voltage ELVSS may be a low-level voltage supplied to an opposite electrode (or a cathode) of a light-emitting diode included in the sub-pixel PX. The power supply circuit 17 may generate a reference voltage Vref, a first initialization voltage Vint, and a second initialization voltage Vaint and supply the same to the sub-pixels PX.

A voltage level of the driving voltage ELVDD may be higher than that of the common voltage ELVSS. A voltage level of the reference voltage Vref may be lower than that of the driving voltage ELVDD. A voltage level of the first initialization voltage Vint may be lower than that of the common voltage ELVSS. A voltage level of the second initialization voltage Vaint may be higher than that of the first initialization voltage Vint. The voltage level of the second initialization voltage Vaint may be equal to or higher than the voltage level of the common voltage ELVSS.

The controller 19 may control operation timings of the gate driving circuit 13 and the data driving circuit 15 and thus control the pixel portion 11. The controller 19 may generate the first to seventh control signals GCS1, GCS2, GCS3, GCS4, GCS5, DCS, and PCS and transmit the first to seventh control signals GCS1, GCS2, GCS3, GCS4, GCS5, DCS, and PCS to the first gate driving circuit 13-1, the second gate driving circuit 13-2, the third gate driving circuit 13-3, the fourth gate driving circuit 13-4, the fifth gate driving circuit 13-5, the data driving circuit 15, and the power supply circuit 17, respectively.

Figure 2:
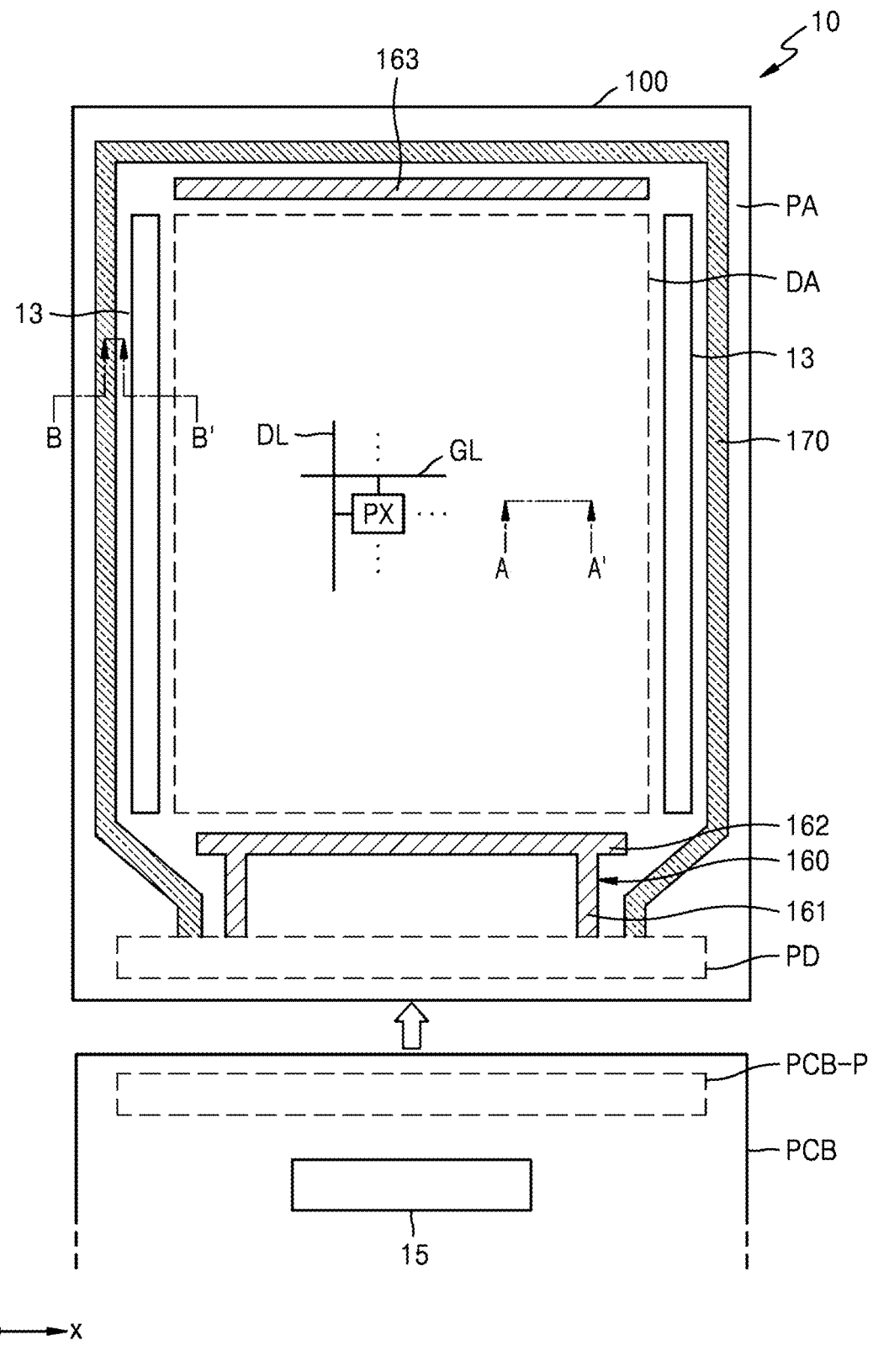
FIG. 2 is a schematic plan view of a display panel included in a display apparatus, according to an embodiment.

FIG. 2 is a schematic plan view of a display panel included in a display apparatus, according to an embodiment.

Referring to FIG. 2, the display apparatus (1 of FIG. 1) may include a display panel 10, and the display panel 10 may include a substrate 100. Various components forming the display apparatus 1 may be disposed above the substrate 100. The substrate 100 may include a display area DA and a peripheral area PA surrounding the display area DA. The display area DA may be covered by a sealing member and protected from external air, moisture, or the like.

In the display area DA, the sub-pixels PX may be arranged. Each sub-pixel PX may include a light-emitting diode. In an embodiment, the light-emitting diode may be an organic light-emitting diode including an organic material as a light-emitting material. In an embodiment, the light-emitting diode may be an inorganic light-emitting diode including an inorganic material. The inorganic light-emitting diode may include a PN junction diode including materials based on an inorganic semiconductor. In case that a voltage is applied to a PN junction diode in a forward direction, electrons and holes may be injected, and energy generated from the recombination of the electrons and holes may be converted into light energy so that certain colors of light may be emitted.

In some embodiments, the light-emitting diode may be in a micro-scale or a nano-scale. For example, the light-emitting diode may be a micro-light-emitting diode. In another example, the light-emitting diode may be a nanorod light-emitting diode. The nanorod light-emitting diode may include gallium nitride (GaN). In some embodiments, the light-emitting diode may include a quantum dot light-emitting diode.

As described above, an emission layer of the light-emitting diode may include organic materials, inorganic materials, quantum dots, both organic materials and quantum dots, or both inorganic materials and quantum dots, or a combination thereof. Hereinafter, for convenience of explanation, the light-emitting diode is described as including an organic light-emitting diode.

The light-emitting diode of each sub-pixel PX may be electrically connected to a sub-pixel circuit, and each sub-pixel circuit may include transistors and capacitors. The sub-pixel circuit may be electrically connected to peripheral circuits arranged in the peripheral area PA. The peripheral circuits arranged in the peripheral area PA of the substrate 100 may include the gate driving circuit 13, a pad portion PD, a first power supply line 160, and a second power supply line 170.

Some or all of the gate driving circuits 13 may be formed in the peripheral area PA of the substrate 100 during a process of forming transistors forming the sub-pixel circuit in the display area DA of the substrate 100. The gate driving circuit 13 may be arranged on both sides of the substrate 100 with respect to the display area DA. The sub-pixel circuit arranged in the display area DA may be electrically connected to at least any one of the gate driving circuits 13 located on the left side or right side of the substrate 100.

The pad portion PD may be arranged on one side of the substrate 100. In an embodiment, the pad portion PD may not be covered by an insulating layer and be exposed, thus being electrically connected to a printed circuit board PCB. A pad portion PCB-P of the printed circuit board PCB may be electrically connected to the pad portion PD of the display panel 10. The printed circuit board PCB may be a rigid circuit board or a flexible circuit board. The printed circuit board PCB may be electrically connected to the display panel 10 or electrically connected to the display panel 10 through another circuit board.

In an embodiment, the data driving circuit 15, the power supply circuit 17 (of FIG. 1), and the controller 19 (of FIG. 1) may be formed as separate integrated circuit chips or a single integrated circuit chip and arranged on the printed circuit board PCB. In an embodiment, the data driving circuit 15, the power supply circuit 17, and the controller 19 may be directly arranged on the substrate 100 of the display panel 10 in a chip on glass (COG) manner or a chip on plastic (COP) manner.

The data driving circuit 15 may generate a data signal, and the generated data signal may be transmitted to the sub-pixel circuit through a fan-out line electrically connected to the pad portion PD and the data line DL electrically connected to the fan-out line.

The power supply circuit 17 may generate the driving voltage (ELVDD of FIG. 1) and the common voltage (ELVSS of FIG. 1), and the generated driving voltage ELVDD and common voltage ELVSS may be provided through the first power supply line 160 and the second power supply line 170, respectively. The driving voltage ELVDD may be applied to the sub-pixel circuit through a driving voltage line electrically connected to the first power supply line 160, and the common voltage ELVSS may be electrically connected to the second power supply line 170 and applied to an opposite electrode (e.g., a cathode) of the light-emitting diode.

The first power supply line 160 may include, for example, a first sub-line 162 and a second sub-line 163 both of which extend in parallel in the x direction with the display area DA therebetween and may include a third sub-line 161 extending in the z direction.

The second power supply line 170 may be arranged to surround the display area DA, at least partially, in the peripheral area PA. The second power supply line 170 may include a portion extending in the y direction and a portion extending in the x direction along the edges of the display area DA. For example, the second power supply line 170 may have a loop shape that may be open towards the pad portion PD.

The second power supply line 170 may be arranged outside the gate driving circuit 13 in the peripheral area PA. The gate driving circuit 13 may be arranged between the display area DA and the second power supply line 170 in the peripheral area PA.

Figure 3:
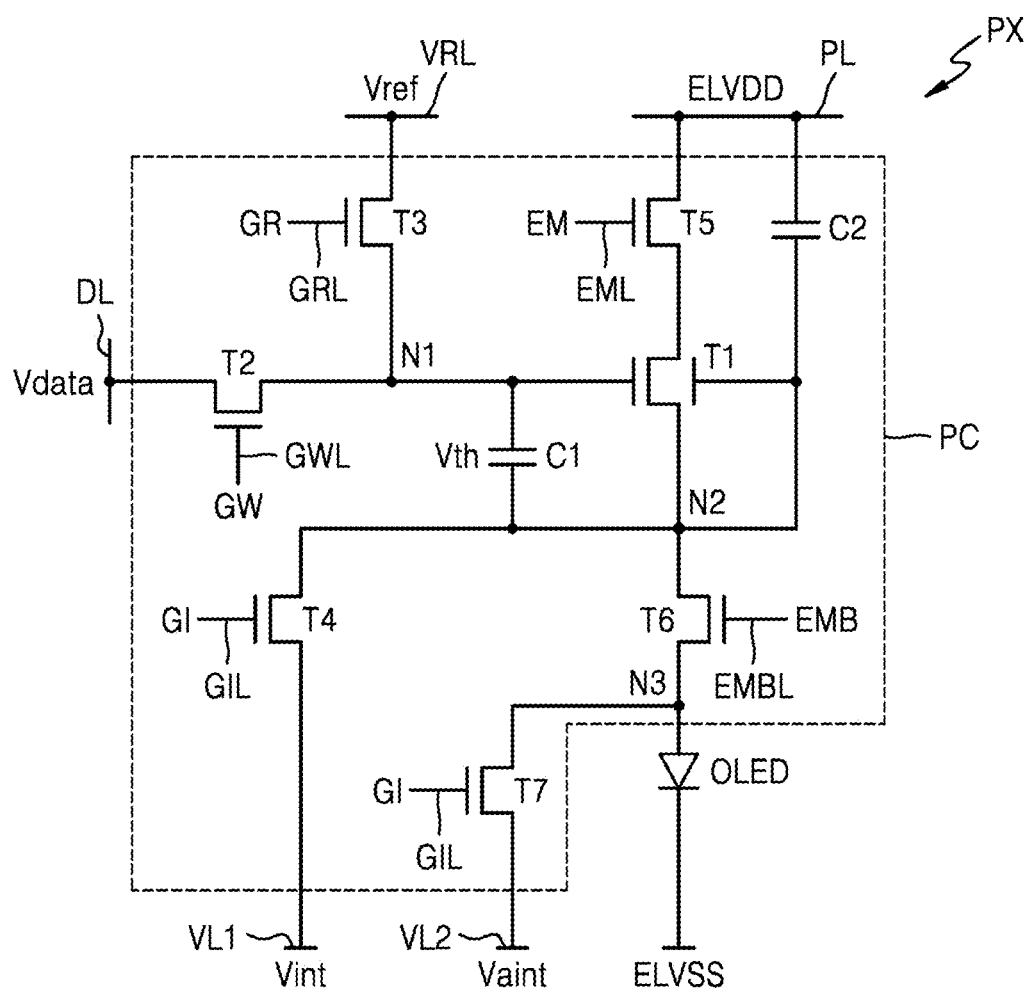
FIG. 3 is a schematic diagram of an equivalent circuit of a sub-pixel according to an embodiment.
Figure 4:
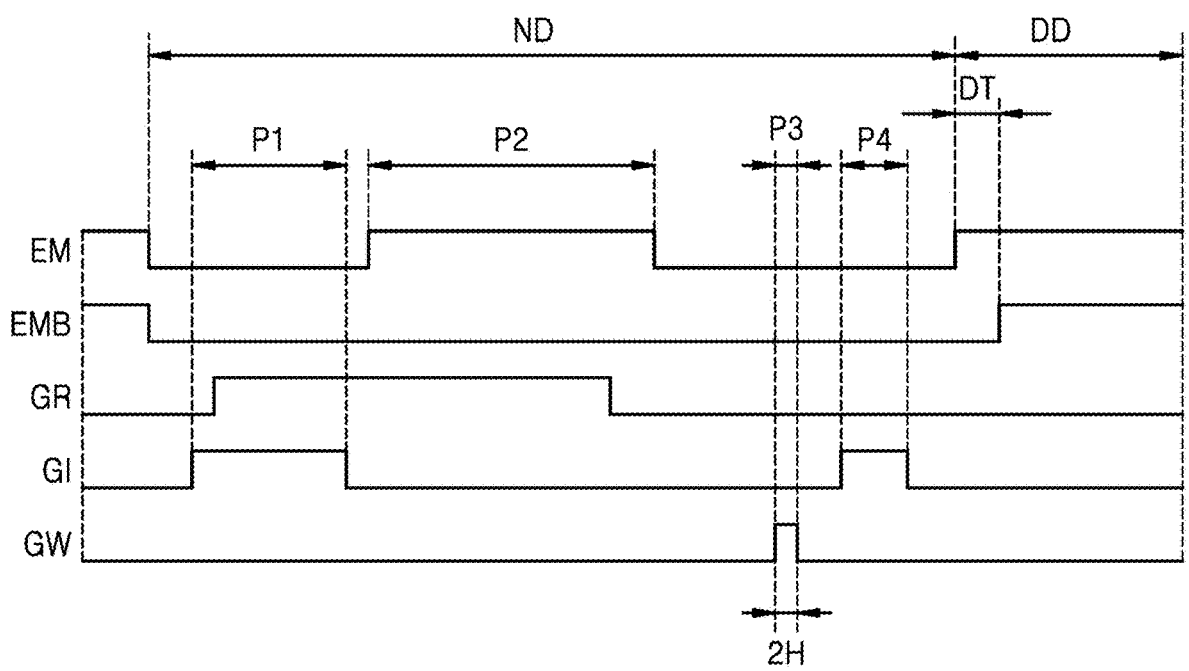
FIG. 4 is a graph illustrating waveforms of signals illustrating an operation of the sub-pixel of FIG. 3.

FIG. 3 is a schematic diagram of an equivalent circuit of a sub-pixel according to an embodiment, and FIG. 4 is a graph illustrating waveforms of signals illustrating an operation of the sub-pixel of FIG. 3.

Referring to FIG. 3, the sub-pixel PX may include an organic light-emitting diode OLED and a sub-pixel circuit PC electrically connected to the organic light-emitting diode OLED. The sub-pixel circuit PC may include a first transistor T1 to a seventh transistor T7, a first capacitor C1, and a second capacitor C2. The first transistor T1 may be a driving transistor configured to output a driving current corresponding to the data signal Vdata, and the second transistor T2 to the seventh transistor T7 may each be a switching transistor configured to transmit a signal.

The first transistor T1 to the seventh transistor T7 may each be implemented as a thin-film transistor. A first terminal and a second terminal of each of the first transistor T1 to the seventh transistor T7 may be a source area or a drain area, and the second terminal may be different from the first terminal. For example, in case that the first terminal is a source area, the second terminal may be a drain area.

The sub-pixels PX may be electrically connected to the first gate line GWL configured to transmit the first gate signal GW, the second gate line GIL configured to transmit the second gate signal GI, the third gate line GRL configured to transmit the third gate signal GR, the fourth gate line EML configured to transmit the fourth gate signal EM, the fifth gate line EMBL configured to transmit the fifth gate signal EMB, and the data line DL configured to transmit the data signal Vdata. The fourth gate signal EM and the fifth gate signal EMB may be referred to as emission control signals, and the fourth gate line EML and the fifth gate line EMBL may be referred to as emission control lines.

The sub-pixels PX may be electrically connected to a driving power line PL configured to transmit the driving voltage ELVDD, a reference voltage line VRL configured to transmit the reference voltage Vref, a first initialization voltage line VL1 configured to transmit the first initialization voltage Vint, and a second initialization voltage line VL2 configured to transmit the second initialization voltage Vaint.

In an embodiment, as shown in FIG. 3, the first transistor T1 to the seventh transistor T7 may each be an n-channel metal-oxide-semiconductor field effect transistor (MOSFET) (NMOS). In an embodiment, some of the first transistor T1 to the seventh transistor T7 may each be an NMOS, and others thereof may each be a p-channel MOSFET (PMOS). In an embodiment, the first transistor T1 to the seventh transistor T7 may each be a PMOS.

In an embodiment, semiconductor layers of the first transistor T1 to the seventh transistor T7 may include oxide semiconductors, respectively. The semiconductor layer of each of the first transistor T1 to the seventh transistor T7 may include oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn), or a combination thereof. For example, the semiconductor layer of each of the first transistor T1 to the seventh transistor T7 may be an InSnZnO (ITZO) semiconductor layer, an InGaZnO (IGZO) semiconductor layer, or the like.

As another example, the semiconductor layer of each of the first transistor T1 to the seventh transistor T7 may include the oxide semiconductor. For example, the semiconductor layer of each of the first transistor T1 to the seventh transistor T7 may include Low Temperature Poly-Silicon (LTPS).

As another example, the semiconductor layers of some of the first transistor T1 to the seventh transistor T7 may include LTPS, and the semiconductor layers of other transistors may include oxide semiconductors (IGZO, etc.).

Because an oxide semiconductor has high carrier mobility and a low leakage current, a voltage drop may not be great despite a long operation time. For example, in the case of the oxide semiconductor, because a color change in images according to the voltage drop may not be noticeable even during a low-frequency operation, the display apparatus may operate at a low frequency. Therefore, in case that the semiconductor layer of each of the first transistor T1 to the seventh transistor T7 includes an oxide semiconductor, a display apparatus may be realized in which the occurrence of a leakage current may be prevented and the amount of power consumed may be reduced. In case that an oxide semiconductor transistor is used, a crystallization process by excimer laser annealing (ELA) may not be required to form an LTPS semiconductor transistor, and thus, the manufacturing costs of a display panel may be considerably reduced. Therefore, it may be advantageous to realize a large display apparatus.

Because the oxide semiconductor is sensitive to light, some changes may be made to the amount of current, etc. because of external light. Therefore, a metal layer may be arranged under the oxide semiconductor to absorb or reflect the external light. In an embodiment, a metal layer may be arranged under the semiconductor layer of at least one of the first transistor T1 to the seventh transistor T7, and the metal layer may function as a lower gate electrode. For example, the first transistor T1 that is a driving transistor may be a double-gate transistor including two gate electrodes. The two gate electrodes may overlap each other at different layers.

The first transistor T1 may be electrically connected between the driving power line PL and the second node N2. The first transistor T1 may include a first gate electrode electrically connected to the first node N1 and a second gate electrode electrically connected to the second node N2. The first gate electrode and the second gate electrode may face each other with the semiconductor layer therebetween. The second gate electrode of the first transistor T1 may be electrically connected to the second terminal of the first transistor T1, may be controlled by a voltage applied to the second terminal of the first transistor T1, and may improve the output saturation characteristic of the first transistor T1. The first terminal of the first transistor T1 may be electrically connected to the driving power line PL via the fifth transistor T5. The second terminal of the first transistor T1 may be electrically connected to a sub-pixel electrode of the organic light-emitting diode OLED via the sixth transistor T6. The first transistor T1 may receive the data signal Vdata according to a switching operation of the second transistor T2 and may be configured to control the amount of driving currents flowing to the organic light-emitting diode OLED.

The second transistor T2 (a data write transistor) may be electrically connected between the data line DL and the first gate electrode of the first transistor T1. The second transistor T2 may include a gate electrode electrically connected to the first gate line GWL, a first terminal electrically connected to the data line DL, and a second terminal electrically connected to the first node N1. The second transistor T2 may be turned on in response to the first gate signal GW transmitted through the first gate line GWL, electrically connect the data line DL to the first node N1, and be configured to transmit, to the first node N1, the data signal Vdata transmitted through the data line DL.

The third transistor T3 (a first initialization transistor) may be electrically connected between the first gate electrode of the first transistor T1 and the reference voltage line VRL. The third transistor T3 may include a gate electrode electrically connected to the third gate line GRL, a first terminal electrically connected to the first node N1, and a second terminal electrically connected to the reference voltage line VRL. The third transistor T3 may be turned on in response to the third gate signal GR transmitted through the third gate line GRL and configured to transmit, to the first node N1, the reference voltage Vref transmitted through the reference voltage line VRL.

The fourth transistor T4 (a second initialization transistor) may be electrically connected between the first transistor T1 and the first initialization voltage line VL1. The fourth transistor T4 may include a gate electrode electrically connected to the second gate line GIL, a first terminal electrically connected to the second node N2, and a second terminal electrically connected to the first initialization voltage line VL1. The fourth transistor T4 may be turned on in response to the second gate signal GI transmitted through the second gate line GIL and configured to transmit, to the second node N2, the first initialization voltage Vint transmitted through the first initialization voltage line VL1.

The fifth transistor T5 (a first emission control transistor) may be electrically connected between the driving power line PL and the first transistor T1. The fifth transistor T5 may include a gate electrode electrically connected to the fourth gate line EML, a first terminal electrically connected to the driving power line PL, and a second terminal electrically connected to the first terminal of the first transistor T1. The fifth transistor T5 may be turned on or off according to the fourth gate signal EM transmitted through the fourth gate line EML.

The sixth transistor T6 (a second emission control transistor) may be electrically connected between the first transistor T1 and the organic light-emitting diode OLED. The sixth transistor T6 may be electrically connected between the second node N2 and a third node N3. The sixth transistor T6 may include a gate electrode electrically connected to the fifth gate line EMBL, a first terminal electrically connected to the second node N2, and a second terminal electrically connected to the third node N3. The second terminal of the sixth transistor T6 may be electrically connected to a first terminal of the seventh transistor T7 and the sub-pixel electrode of the organic light-emitting diode OLED. The sixth transistor T6 may be turned on or off according to the fifth gate signal EMB transmitted through the fifth gate line EMBL.

FIG. 3 shows that the fifth transistor T5 and the sixth transistor T6 respectively operate in response to the fourth gate signal EM and the fifth gate signal EMB, which may be different from each other, but in an embodiment, the fifth transistor T5 and the sixth transistor T6 may operate in response to the same gate signal. The gate electrode of each of the fifth transistor T5 and the sixth transistor T6 may be electrically connected to the same gate line.

The seventh transistor T7 (a third initialization transistor) may be electrically connected between the organic light-emitting diode OLED and the second initialization voltage line VL2. The seventh transistor T7 may be electrically connected between the sixth transistor T6 and the second initialization voltage line VL2. The seventh transistor T7 may include a gate electrically connected to the second gate line GIL, the first terminal electrically connected to the third node N3, and a second terminal electrically connected to the second initialization voltage line VL2. The seventh transistor T7 may be turned on in response to the second gate signal GI transmitted through the second gate line GIL and configured to transmit, to the third node N3, the second initialization voltage Vaint transmitted through the second initialization voltage line VL2.

FIG. 3 shows that the fourth transistor T4 and the seventh transistor T7 operate in response to the same second gate signal GI, but in an embodiment, the fourth transistor T4 and the seventh transistor T7 may operate in response to different gate signals. The fourth transistor T4 and the seventh transistor T7 may be electrically connected to different gate lines.

The first capacitor C1 may be electrically connected between the first gate electrode of the first transistor T1 and the second terminal of the first transistor T1. The first electrode of the first capacitor C1 may be electrically connected to the first node N1, and the second electrode may be electrically connected to the second node N2. The first electrode of the first capacitor C1 may be electrically connected to the first gate electrode of the first transistor T1, the second terminal of the second transistor T2, and the second terminal of the third transistor T3. The second electrode of the first capacitor C1 may be electrically connected to the second terminal and the second gate electrode of the first transistor T1, the second electrode of the second capacitor C2, the first terminal of the fourth transistor T4, and the first terminal of the sixth transistor T6. The first capacitor C1 may be a storage capacitor and configured to store a threshold voltage Vth of the first transistor T1 and a voltage corresponding to the data signal Vdata.

The second capacitor C2 may be electrically connected between the driving power line PL and the second node N2. The first electrode of the second capacitor C2 may be electrically connected to the driving power line PL. The second electrode of the second capacitor C2 may be electrically connected to the second terminal and the second gate electrode of the first transistor T1, the second electrode of the first capacitor C1, the first terminal of the fourth transistor T4, and the first terminal of the sixth transistor T6. The second capacitor C2 may be a holding capacitor. For reference, a capacitance of the first capacitor C1 may be greater than that of the second capacitor C2.

The organic light-emitting diode OLED may be electrically connected to the first transistor T1 through the sixth transistor T6. The organic light-emitting diode OLED may include a sub-pixel electrode (or an anode) electrically connected to the third node N3 and an opposite electrode (or a cathode) facing the sub-pixel electrode, and the opposite electrode may receive the common voltage ELVSS. The opposite electrode may be a common electrode that is common for the sub-pixels PX.

FIG. 3 shows that the sub-pixel circuit PC includes seven transistors and two capacitors, but in an embodiment, the sub-pixel circuit PC may include five transistors and two capacitors. In an embodiment, the sub-pixel circuit PC may include sixth transistors and two capacitors.

Referring to FIG. 4, the sub-pixel PX may operate for at least one scan period in one frame. One scan period may include a non-emission period ND and an emission period DD. The non-emission period ND may be a period in which the sub-pixels PX do not emit light and include a first period P1, a second period P2, a third period P3, and a fourth period P4.

Each of the first gate signal GW, the second gate signal GI, the third gate signal GR, the fourth gate signal EM, and the fifth gate signal EMB applied to the sub-pixels PX may have a high-level voltage during some periods and a low-level voltage during other periods. Here, the high-level voltage may be an on voltage at which a transistor is turned on, and the low-level voltage may be an off voltage at which a transistor is turned off.

The first period P1 may be a first initialization period in which the first node N1, which is electrically connected to the first gate electrode of the first transistor T1, and the third node N3, which is electrically connected to the sub-pixel electrode of the organic light-emitting diode OLED, may be initialized. In the first period P1, the second gate signal GI having the on voltage may be provided to the second gate line GIL. The third gate signal GR having the on voltage may be provided to the third gate line GRL. The first gate signal GW, the fourth gate signal EM, and the fifth gate signal EMB may be provided as off voltages. The timing at which the on voltage of the third gate signal GR is applied may be delayed by a certain period of time, compared to the timing at which the on voltage of the second gate signal GI is applied.

The fourth transistor T4 and the seventh transistor T7 may be turned on according to the second gate signal GI, and the third transistor T3 may be turned on according to the third gate signal GR. The second node N2, that is, the second terminal of the first transistor T1, may be initialized to the first initialization voltage Vint by the fourth transistor T4 that is on. The first node N1, that is, the first gate electrode of the first transistor T1, may be initialized to the reference voltage Vref by the third transistor T3 that is on. The third node N3, that is, the sub-pixel electrode of the organic light-emitting diode OLED, may be initialized to the second initialization voltage Vaint by the seventh transistor T7 that is on. The first capacitor C1 and the second capacitor C2 may be initialized by the third transistor T3 and the fourth transistor T4 which are on.

The second period P2 may be a compensation period in which the threshold voltage of the first transistor T1 is compensated. In the second period P2, the third gate signal GR having the on voltage may be provided to the third gate line GRL, and the fourth gate signal EM may be provided to the fourth gate line EML. The first gate signal GW, the second gate signal GI, and the fifth gate signal EMB may be provided as off voltages.

The third transistor T3 may be turned on according to the third gate signal GR, and the fifth transistor T5 may be turned on according to the fourth gate signal EM. Accordingly, the first transistor T1 may be turned on based on supplying the reference voltage Vref to the first node N1 and the driving voltage ELVDD to the first terminal of the first transistor T1. In case that the voltage of the second terminal of the first transistor T1 drops to be less than or equal to a difference between the reference voltage Vref and the threshold voltage Vth of the first transistor T1, the first transistor T1 may be turned off. A voltage corresponding to the threshold voltage Vth of the first transistor T1 may be stored in the first capacitor C1, and thus, the threshold voltage Vth of the first transistor T1 may be compensated.

The third period P3 may be a data write period in which the data signal Vdata is provided to the sub-pixel PX. In the third period P3, the first gate signal GW having the on voltage may be provided to the first gate line GWL. In an embodiment, the on voltage of the first gate signal GW may have a width of approximately two horizontal periods 2H. The second gate signal GI, the third gate signal GR, the fourth gate signal EM, and the fifth gate signal EMB may be provided as off voltages.

The second transistor T2 may be turned on according to the first gate signal GW, and the second transistor T2, which is on, may be configured to transmit the data signal Vdata, via the data line DL, to the first node N1, that is, the first gate electrode of the first transistor T1. Accordingly, the voltage of the first node N1 may be changed from the reference voltage Vref to the voltage corresponding to the data signal Vdata. The voltage of the second node N2 may also be changed according to the variation in the voltage of the first node N1. The voltage of the second node N2 may be a voltage that is changed according to a capacitance ratio of the first capacitor C1 and the second capacitor C2. Accordingly, the threshold voltage Vth of the first transistor T1 and the voltage corresponding to the data signal Vdata may be charged to the first capacitor C1.

The fourth period P4 may be a second initialization period in which the second node N2, which is electrically connected to the second terminal of the first transistor T1, and the third node N3, which is electrically connected to the sub-pixel electrode of the organic light-emitting diode OLED, are initialized before the emission period DD. In the fourth period P4, the second gate signal GI having the on voltage is provided to the second gate line GIL, and thus, the fourth transistor T4 and the seventh transistor T7 may be turned on. The first gate signal GW, the third gate signal GR, the fourth gate signal EM, and the fifth gate signal EMB may be provided as off voltages.

The fourth transistor T4 and the seventh transistor T7 may be turned on according to the second gate signal GI, and the first initialization voltage Vint may be transmitted to the second terminal of the first transistor T1 by the fourth transistor T4 that is on. The second initialization voltage Vaint may be transmitted to the sub-pixel electrode of the organic light-emitting diode OLED by the seventh transistor T7 that is on.

In case that a low gradation (e.g., 11 to 31 gradations) is expressed, a change in luminance may occur due to the remaining voltage in the organic light-emitting diodes OLED. The third node N3 may be initialized during the fourth period P4 after the data writing and before the sub-pixel emission, which leads to the decrease in the luminance change in the organic light-emitting diodes OLED during expression of low gradations. Accordingly, the image quality of the display apparatus may be improved. As a voltage different from the first initialization voltage Vint, for example, a higher voltage than the first initialization voltage Vint, is used as the second initialization voltage Vaint, the voltage change time of the sub-pixel electrode may be reduced, and thus, screen flickering may decrease.

The emission period DD may be a period in which the sub-pixel PX, that is, the organic light-emitting diode OLED, emits light. In the emission period DD, the fourth gate signal EM having the on voltage may be provided to the fourth gate line EM, and the fifth gate signal EMB having the on voltage may be provided to the fifth gate line EMBL. The first gate signal GW, the second gate signal GI, and the third gate signal GR may be provided as off voltages.

In the emission period DD, the fifth transistor T5 may be turned on according to the fourth gate signal EM, and the sixth transistor T6 may be turned on according to the fifth gate signal EMB. The timing at which the on voltage of the fifth gate signal EMB is applied may be delayed by about a certain period DT, compared to the timing at which the on voltage of the fourth gate signal EM is applied. The driving voltage ELVDD may be provided to the first terminal of the first transistor T1 by the fifth transistor T5 that is on. The first transistor T1 may emit light at a brightness corresponding to an intensity of a driving current corresponding to the voltage corresponding to the data signal Vdata, the voltage being stored in the first capacitor C1.

Such an operation mode is merely an example, and the display apparatus according to an embodiment may operate in a different operation mode.

Figure 5:
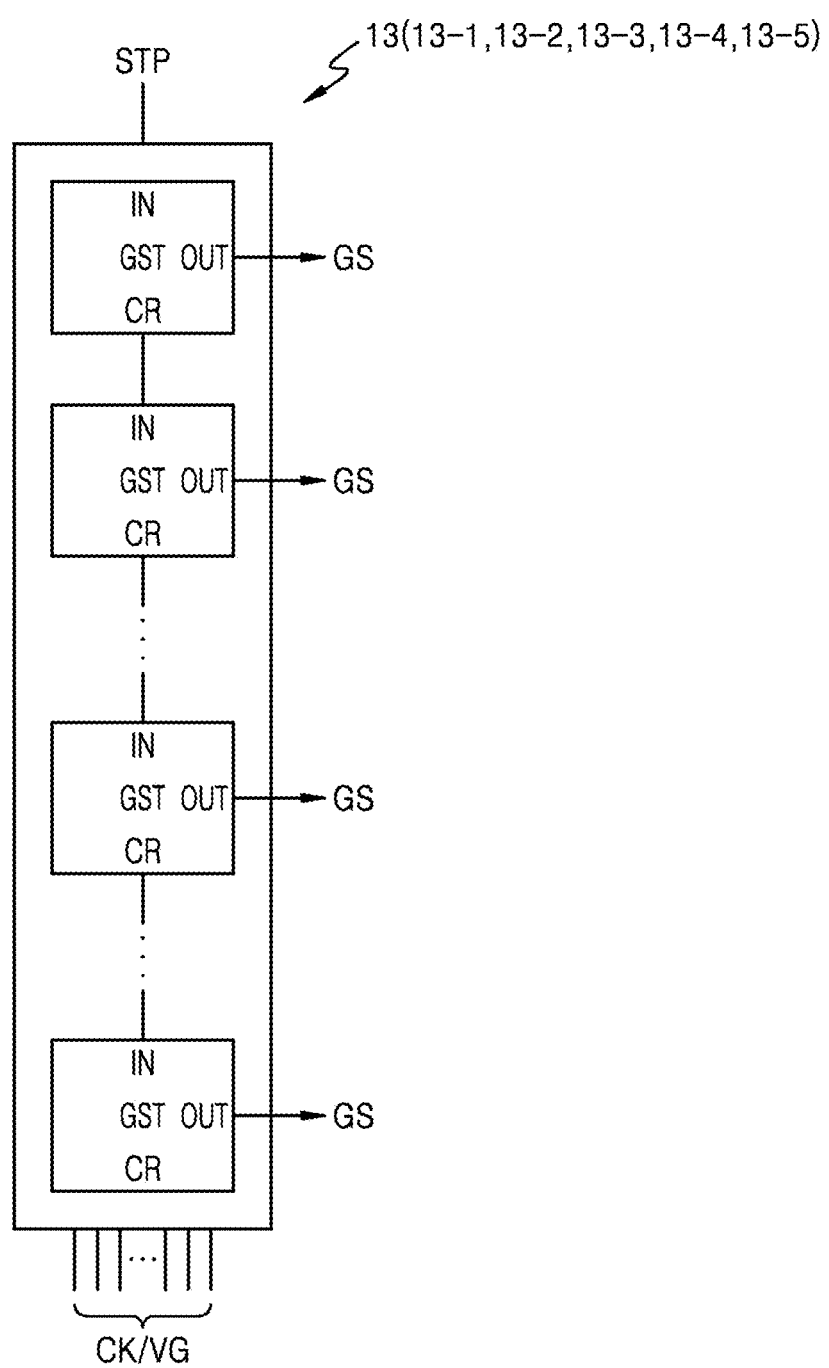
FIG. 5 is a schematic diagram of a gate driving circuit according to an embodiment.

FIG. 5 is a schematic diagram of a gate driving circuit according to an embodiment.

Referring to FIG. 5, the gate driving circuit 13 may include gate driving circuits, e.g., five gate driving circuits. For example, the gate driving circuit 13 may include a first gate driving circuit 13-1, a second gate driving circuit 13-2, a third gate driving circuit 13-3, a fourth gate driving circuit 13-4, and a fifth gate driving circuit 13-5. However, one or more embodiments are not limited thereto, and the gate driving circuit 13 may include three or four gate driving circuits. Some of the gate driving circuits may be integrated. Each gate driving circuit may include stages GST arranged in the y direction (the column direction).

The stages GST may be electrically connected to each other in the form of a shift register. For example, gate signals GS may be generated in a manner that a turn-on level pulse of a start signal STP provided to a first stage GST may be sequentially transmitted to a subsequent stage GST. A start signal line, through which the start signal STP is provided, may be electrically connected to the first stage GST from among the stages GST of the gate driving circuit 13. The stages GST may generate the gate signals GS, based on a start signal or an output signal of the previous stage GST (e.g., a gate signal GS generated by a previous stage).

Each stage GST may receive at least one clock signal CK and at least one voltage signal VG and generate at least one gate signal GS. The stage GST may receive via one or more input terminals IN at least one clock signal CK through at least one clock line CKL and at least one voltage signal VG through at least one voltage line VL.

Each stage GST may output via one or more output terminals OUT at least one gate signal GS through at least one gate line. For example, each stage GST of the first gate driving circuit 13-1 may output the first gate signal GW through the first gate line GWL. Each stage GST of the second gate driving circuit 13-2 may output the second gate signal GI through the second gate line GIL. Each stage GST of the third gate driving circuit 13-3 may output the third gate signal GR through the third gate line GRL, and each stage GST of the fourth gate driving circuit 13-4 may output the fourth gate signal EM through the fourth gate line EML. Each stage GST of the fifth gate driving circuit 13-5 may output the fifth gate signal EMB through the fifth gate line EMBL.

Figure 6:
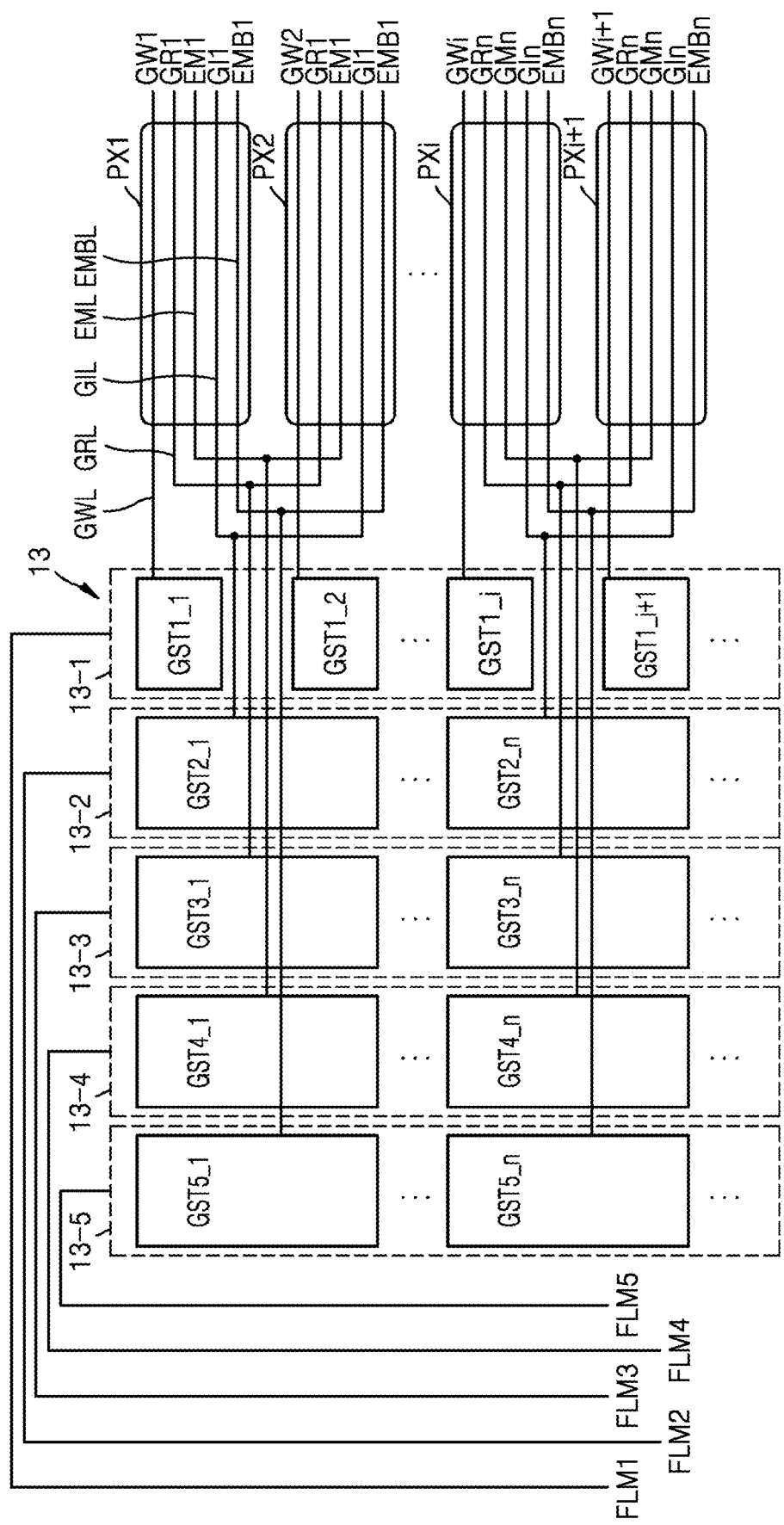
FIG. 6 is a schematic diagram illustrating a gate driving circuit, start signal lines electrically connected to the gate driving circuit, and gate lines electrically connected to the sub-pixel, according to an embodiment.

FIG. 6 is a schematic diagram illustrating a gate driving circuit, start signal lines electrically connected to the gate driving circuit, and gate lines electrically connected to the sub-pixel, according to an embodiment.

Referring to FIG. 6, the gate driving circuit 13 may include a first gate driving circuit 13-1, a second gate driving circuit 13-2, a third gate driving circuit 13-3, a fourth gate driving circuit 13-4, and a fifth gate driving circuit 13-5. The first gate driving circuit 13-1 to the fifth gate driving circuit 13-5 may be arranged in the x direction (the row direction).

In an embodiment, different start signal lines may be electrically connected to the first stages of respective gate driving circuits. The start signal lines may be provided in the number corresponding to the number of gate driving circuits. However, one or more embodiments are not limited thereto. In an embodiment, one start signal line may be electrically connected to the first stages of the gate driving circuits. For example, the display apparatus 1 may include a first start signal line FLM1 to a fifth start signal line FLM5 respectively corresponding to the first gate driving circuit 13-1 to the fifth gate driving circuit 13-5.

The first gate driving circuit 13-1 may include first stages GST1_1, GST1_2, ..., GST1_i, GST1_i+1, ..., and each of the first stages GST1_1, GST1_2, ..., GST1_i, GST1_i+1, ... may correspond to each row of the pixel portion (11 of FIG. 1).

The 1st first stage GST1_1 from among the first stages GST1_1, GST1_2, ..., GST1_i, GST1_i+1, ... of the first gate driving circuit 13-1 may be electrically connected to the first start signal line FLM1. In case that a start signal STP is transmitted through the first start signal line FLM1, the first stages GST1_1, GST1_2, ..., GST1_i, GST1_i+1, ... may sequentially generate and output the first gate signals GW to the first gate lines GWL in their corresponding rows, respectively.

The $1^{st}$ first stage GST1_1 arranged to correspond to the first row of the first gate driving circuit 13-1 may output a $1^{st}$ first gate signal GW1 to a $1^{st}$ first gate line GWL electrically connected to a $1^{st}$ sub-pixel PX1 arranged in the $1^{st}$ row.

The $2^{nd}$ first stage GST1_2 arranged to correspond to the second row of the second gate driving circuit 13-2 may output a $2^{nd}$ first gate signal GW2 to a $2^{nd}$ first gate line GWL electrically connected to a $2^{nd}$ sub-pixel PX1 arranged in the $2^{nd}$ row.

The $i^{th}$ first stage GST1_i arranged to correspond to an $i^{th}$ row of the first gate driving circuit 13-1 may output an $i^{th}$ first gate signal GWi to an $i^{th}$ first gate line GWL electrically connected to an $i^{th}$ sub-pixel PXi arranged in the $i^{th}$ row.

The $(i+1)^{th}$ first stage GST1_i+1 arranged to correspond to an $(i+1)^{th}$ row of the first gate driving circuit 13-1 may output an $(i+1)^{th}$ first gate signal GWi+1 to an $(i+1)^{th}$ first gate line GWL electrically connected to an $(i+1)^{th}$ sub-pixel PXi+1 arranged in the $(i+1)^{th}$ row.

The first sub-pixel PX1, the second sub-pixel PX2, the $i^{th}$ sub-pixel PXi, and the (i+1)th sub-pixel PXi+1 may be sub-pixels arranged in the same column and may have substantially the same sub-pixel structures.

The second gate driving circuit 13-2 may include second stages GST2_1, ..., GST2_n, ..., and the second stages GST2_1, ..., GST2_n, ... may respectively correspond to two or more rows of the pixel portion 11. For example, each of the second stages GST2_1, ..., GST2_n, ... may correspond to two rows of the pixel portion 11.

The $1^{st}$ second stage GST2_1 from among the second stages GST2_1, ..., GST2_n, ... of the second gate driving circuit 13-2 may be electrically connected to the second start signal line FLM2. In case that the start signal STP is transmitted through the second start signal line FLM2, the second stages GST2_1, ..., GST2_n, ... may sequentially generate and output the second gate signals GI onto the second gate lines GIL in their corresponding rows, respectively. For example, the $1^{st}$ second stage GST2_1 of the second gate driving circuit 13-2 may output $1^{st}$ second gate signals GI1 simultaneously to the second gate lines GIL arranged in two rows and electrically connected to the $1^{st}$ sub-pixel PX1 and the $2^{nd}$ sub-pixel PX2.

The $n^{th}$ second stage GST2_n of the second gate driving circuit 13-2 may output $n^{th}$ second gate signals GIn simultaneously to the $i^{th}$ second gate line GIL electrically connected to the $i^{th}$ sub-pixel PXi and the $(i+1)^{th}$ second gate line GIL electrically connected to the $(i+1)^{th}$ sub-pixel PXi_1.

The third gate driving circuit 13-3 may include third stages GST3_1, ..., GST3_n, ..., and the third stages GST3_1, ..., GST3_n, ... may respectively correspond to two or more rows of the pixel portion 11. For example, each of the third stages GST3_1, ..., GST3_n, ... may correspond to two rows of the pixel portion 11.

The $1^{st}$ third stage GST3_1 from among the third stages GST3_1, ..., GST3_n, ... of the third gate driving circuit 13-3 may be electrically connected to a third start signal line FLM3. In case that the start signal STP is transmitted through the third start signal line FLM3, the third stages GST3_1, ..., GST3_n, ... may sequentially generate the third gate signals GR and output the third gate signals GR to the third gate lines GRL in their corresponding rows, respectively. For example, the $1^{st}$ third stage GST3_1 of the third gate driving circuit 13-3 may output the $1^{st}$ third gate signals GR1 simultaneously to the $1^{st}$ third gate line GRL arranged in two rows and electrically connected to the $1^{st}$ sub-pixel PX1 and the $2^{nd}$ third gate line GRL electrically connected to the $2^{nd}$ sub-pixel PX2.

The $n^{th}$ third stage GST3_n of the third gate driving circuit 13-3 may output $n^{th}$ third gate signals GRn simultaneously to the $i^{th}$ third gate line GRL electrically connected to the $i^{th}$ sub-pixel PXi and the $(i+1)^{th}$ third gate line GRL electrically connected to the $(i+1)^{th}$ sub-pixel PXi_1.

The fourth gate driving circuit 13-4 may include fourth stages GST4_1, ..., GST4_n, ..., and the fourth stages GST4_1, ..., GST4_n, ... may respectively correspond to two or more rows of the pixel portion 11. For example, each of the fourth stages GST4_1, ..., GST4_n, ... may correspond to two rows of the pixel portion 11.

The $1^{st}$ fourth stage GST4_1 from among the fourth stages GST4_1, ..., GST4_n, ... of the fourth gate driving circuit 13-4 may be electrically connected to a fourth start signal line FLM4. In case that the start signal STP is transmitted through the fourth start signal line FLM4, the fourth stages GST4_1, ..., GST4_n, ... may sequentially generate and output the fourth gate signals EM to the fourth gate lines EML in their corresponding rows, respectively. For example, the $1^{st}$ fourth stage GST4_1 of the fourth gate driving circuit 13-4 may output $1^{st}$ fourth gate signals EM1 simultaneously to the fourth gate lines EML arranged in two rows and electrically connected to the $1^{st}$ sub-pixel PX1 and the $2^{nd}$ sub-pixel PX2.

The $n^{th}$ fourth stage GST4_n of the fourth gate driving circuit 13-4 may output $n^{th}$ fourth gate signals EMn to the $i^{th}$ fourth gate line EML electrically connected to the $i^{th}$ sub-pixel PXi and the $(i+1)^{th}$ fourth gate line EML electrically connected to the $(i+1)^{th}$ sub-pixel PXi_1.

The fifth gate driving circuit 13-5 may include fifth stages GST5_1, ..., GST5_n, ..., and the fifth stages GST5_1, ..., GST5_n, ... may respectively correspond to two or more rows of the pixel portion 11. For example, each of the fifth stages GST5_1, . . . , GST5_$n$, . . . may correspond to two rows of the pixel portion 11.

The 1$^{st}$ fifth stage GST5_1 from among the fifth stages GST5_1, . . . , GST5_$n$, . . . of the fifth gate driving circuit 13-5 may be electrically connected to a fifth start signal line FLM5. In case that the start signal STP is transmitted through the fifth start signal line FLM5, the fifth stages GST5_1, . . . , GST5_$n$, . . . may sequentially generate and output the fifth gate signals EMB onto the fifth gate lines EMBL in their corresponding rows, respectively. For example, the 1$^{st}$ fifth stage GST5_1 of the fifth gate driving circuit 13-5 may output 1$^{st}$ fifth gate signals EMB1 simultaneously to the fifth gate lines EMBL arranged in two rows and electrically connected to the 1$^{st}$ sub-pixel PX1 and the 2$^{nd}$ sub-pixel PX2.

The n$^{th}$ fifth stage GST5_$n$ of the fifth gate driving circuit 13-5 may output n$^{th}$ fifth gate signals EMBn simultaneously to an i$^{th}$ fifth gate line EMBL electrically connected to the i$^{th}$ sub-pixel PXi and an (i+1)$^{th}$ fifth gate line EMBL electrically connected to the (i+1)$^{th}$ sub-pixel PXi_1.

Such structures of the gate driving circuits are merely examples, and a display apparatus according to an embodiment may include different structures of the gate driving circuits.

Figure 7:
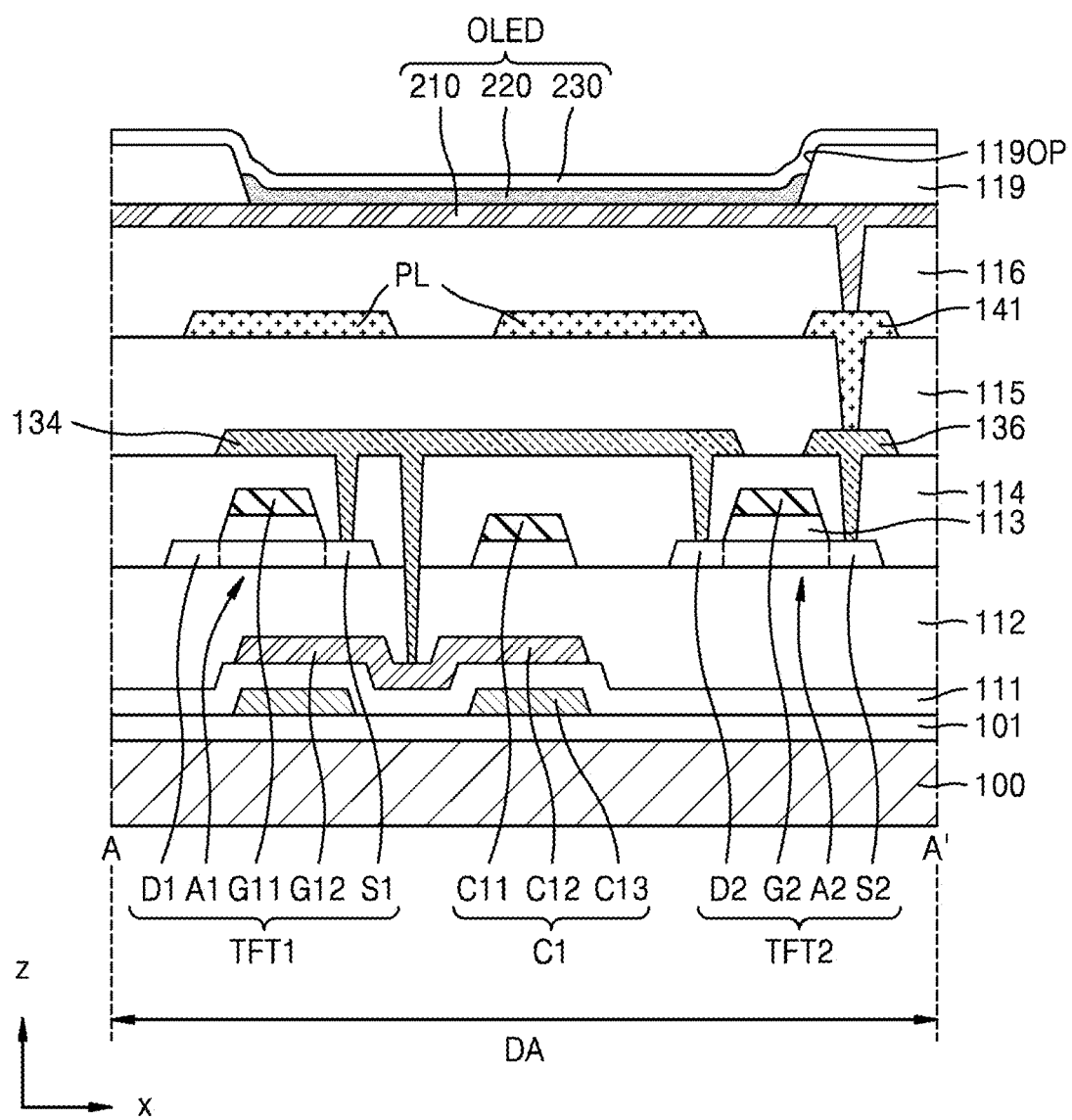
FIG. 7 is a schematic cross-sectional view of a portion of a display apparatus according to an embodiment.
Figure 8:
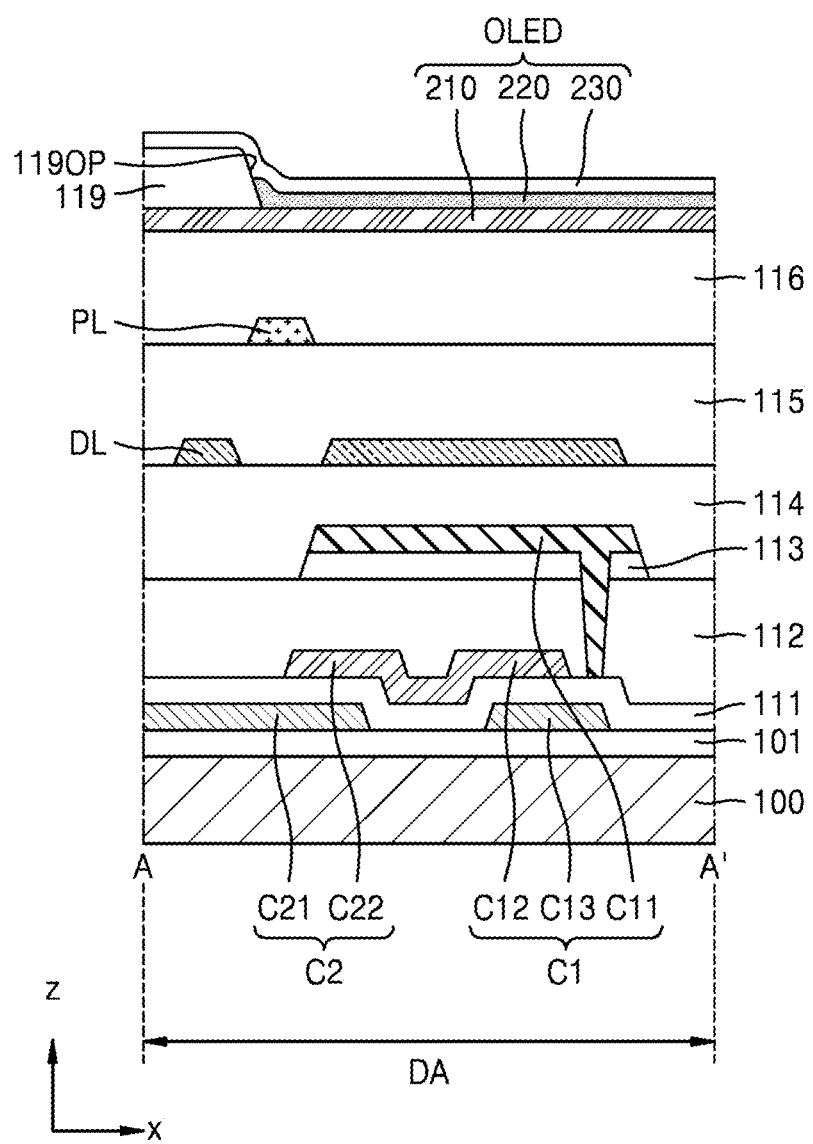
FIG. 8 is a schematic cross-sectional view of a portion of a display apparatus according to an embodiment.

FIGS. 7 and 8 are schematic cross-sectional views of a portion of a display apparatus, according to an embodiment.

Referring to FIGS. 7 and 8, the display apparatus 1 may include sub-pixels arranged in a display area DA. The sub-pixels may include organic light-emitting diodes OLED, and the organic light-emitting diodes OLED may be electrically connected to sub-pixel circuits. The sub-pixel circuit may correspond to the sub-pixel circuit PC of FIG. 3. The sub-pixel circuit may include transistors and capacitors. FIGS. 7 and 8 show a first transistor TFT1, a second transistor TFT2, a first capacitor C1, and a second capacitor C2.

In an embodiment, the first transistor TFT1 may include a first semiconductor layer A1, a first upper gate electrode G11, a first lower gate electrode G12, a first source area S1, and a first drain area D1. The second transistor TFT2 may include a second semiconductor layer A2, a second gate electrode G2, a second source area S2, and a second drain area D2. The first capacitor C1 may include a first electrode C11, a second electrode C12, and a third electrode C13. The second capacitor C2 may include a first electrode C21 and a second electrode C22.

The substrate 100 may include a glass material, a ceramic material, a metal material, or a flexible or bendable material, or a combination thereof. The substrate 100 may include materials that are flexible or bendable, or a combination thereof. In case that the substrate 100 is flexible or bendable, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate, or a combination thereof.

The substrate 100 may have a single-layer structure or a multilayered structure including the above materials, and in case that the substrate 100 has a multilayered structure, the substrate 100 may further include an inorganic layer. In some embodiments, the substrate 100 may have a structure of organic/inorganic/organic materials.

A barrier layer 101 may be disposed above the substrate 100. The barrier layer 101 may prevent or reduce the penetration of impurities from the substrate 100, etc. The barrier layer 101 may include an inorganic material, such as oxide or nitride, an organic material, or a compound of organic and inorganic materials and have a single-layer structure or a multilayered structure including organic and inorganic materials, or a combination thereof.

The third electrode C13 of the first capacitor C1 and the first electrode C21 of the second capacitor C2 may be disposed above the barrier layer 101. In an embodiment, the first electrode C21 of the second capacitor C2 may be electrically connected to the driving power line PL.

The third electrode C13 of the first capacitor C1 and the first electrode C21 of the second capacitor C2 may include molybdenum (Mo), aluminum (Al), copper (Cu), titanium (Ti), or the like, or a combination thereof, and may be a layer or layers. For example, the third electrode C13 of the first capacitor C1 and the first electrode C21 of the second capacitor C2 may each be a single Mo layer.

A first barrier layer 111 may be disposed above the barrier layer 101 to cover the third electrode C13 of the first capacitor C1 and the first electrode C21 of the second capacitor C2. The first buffer layer 111 may decrease or prevent the penetration of foreign impurities, moisture, or external air from the bottom of the substrate 100. The first buffer layer 111 may include an inorganic material such as oxide or nitride, an organic material, or a compound of organic and inorganic materials, or a combination thereof, and may have a single-layer structure or a multilayered structure including organic and/or inorganic materials.

The second electrode C12 of the first capacitor C1, the second electrode C22 of the second capacitor C2, and the first lower gate electrode G12 of the first transistor TFT1 may be disposed above the first buffer layer 111. In an embodiment, the second electrode C12 of the first capacitor C1, the second electrode C22 of the second capacitor C2, and the first lower gate electrode G12 of the first transistor TFT1 may be integral with each other.

The second electrode C12 of the first capacitor C1, the second electrode C22 of the second capacitor C2, and the first lower gate electrode G12 of the first transistor TFT1 may each include Mo, Al, Cu, Ti, or the like and may be a layer or layers. For example, the second electrode C12 of the first capacitor C1, the second electrode C22 of the second capacitor C2, and the first lower gate electrode G12 of the first transistor TFT1 may each be a single Al layer.

The second electrode C22 of the second capacitor C2 may overlap the first electrode C21 thereunder. The first electrode C21 and the second electrode C22 of the second capacitor C2 may overlap each other with the first buffer layer 111 therebetween, thus forming the second capacitor C2.

A second buffer layer 112 may be disposed above the first buffer layer 111 to cover the second electrode C12 of the first capacitor C1, the second electrode C22 of the second capacitor C2, and the first lower gate electrode G12 of the first transistor TFT1. The second buffer layer 112 may include an inorganic material such as oxide or nitride, an organic material, or a compound of organic and inorganic materials, or a combination thereof, and have a single-layer structure or a multilayered structure including organic and inorganic materials.

The first semiconductor layer A1 of the first transistor TFT1 and the second semiconductor layer A2 of the second transistor TFT2 may be disposed above the second buffer layer 112. In an embodiment, the first semiconductor layer A1 and the second semiconductor layer A2 may each include an oxide semiconductor. For example, the first semiconductor layer A1 and the second semiconductor layer A2 may each include a Zn oxide-based material, such as Zn oxide, In—Zn oxide, or Ga—In—Zn oxide. In another example, the first semiconductor layer A1 and the second semiconductor layer A2 may each include In—Ga—Zn—O (IGZO), In—Sn—Zn—O (ITZO), or In—Ga—Sn—Zn—O (IGTZO), in which zinc oxide (ZnO$_x$: ZnO or ZnO$_2$) may be mixed with a metal, such as In, Ga, or Sn.

The first semiconductor layer A1 of the first transistor TFT1 and the second semiconductor layer A2 of the second transistor TFT2 may each include a channel area and source and drain areas located on both sides of the channel area. In some cases, the source area and the drain area may be interpreted as a source electrode and a drain electrode of a transistor. The first semiconductor layer A1 may include a first source area S1 and a first drain area D1 of the first transistor TFT1. The second semiconductor layer A2 may include a second source area S2 and a second drain area D2 of the second transistor TFT2.

The first upper gate electrode G11 and the first lower gate electrode G12 of the first transistor TFT1 may overlap the channel area of the first semiconductor layer A1. The second gate electrode G2 of the second transistor TFT2 may overlap the channel area of the second semiconductor layer A2.

A gate insulating layer 113 may be disposed above the second buffer layer 112, the first semiconductor layer A1, and the second semiconductor layer A2. The gate insulating layer 113 may include an inorganic insulating layer including silicon oxide, silicon nitride, silicon oxynitride, aluminum oxide, or the like, or a combination thereof.

The gate insulating layer 113 may be arranged to cover the first semiconductor layer A1 and the second semiconductor layer A2, but as shown in FIG. 7, the gate insulating layer 113 may be patterned to have the same shape as an electrode layer disposed above the gate insulating layer 113.

The first upper gate electrode G11 of the first transistor TFT1, the second gate electrode G2 of the second transistor TFT2, and the first electrode C11 of the first capacitor C1 may be disposed above the gate insulating layer 113. The first upper gate electrode G11 of the first transistor TFT1, the second gate electrode G2 of the second transistor TFT2, and the first electrode C11 of the first capacitor C1 may each include Mo, Al, Cu, Ti, or the like and may each be a layer or layers. For example, the first upper gate electrode G11 of the first transistor TFT1, the second gate electrode G2 of the second transistor TFT2, and the first electrode C11 of the first capacitor C1 may each be a single Mo layer.

The first electrode C11 of the first capacitor C1 may overlap the second electrode C12 and the third electrode C13 of the first capacitor C1. The first electrode C11 of the first capacitor C1 may be in electrical contact with the third electrode C13 of the first capacitor C1 through a contact hole penetrating the first buffer layer 111, the second buffer layer 112, and the gate insulating layer 113 and may be electrically connected to the third electrode C13. That is, the first capacitor C1 may include the third electrode C13, the second electrode C12, and the first electrode C11 which sequentially overlap each other above the substrate 100 in a z direction and may electrically connect the first electrode C11 to the third electrode C13.

In an embodiment, the first capacitor C1 and the first transistor TFT1 may not overlap each other. In some embodiments, the first capacitor C1 and the first transistor TFT1 may overlap each other. The first upper gate electrode G11 of the first transistor TFT1 may function as the first electrode C11 of the first capacitor C1.

An interlayer insulating layer 114 may be disposed above the gate insulating layer 113 to cover the first upper gate electrode G11 of the first transistor TFT1, the second gate electrode G2 of the second transistor TFT2, and the first electrode C11 of the first capacitor C1.

The interlayer insulating layer 114 may include silicon oxide, silicon nitride, silicon oxynitride, aluminum oxide, titanium oxide, tantalum oxide, hafnium oxide, zinc oxide, or the like, or a combination thereof. The interlayer insulating layer 114 may be a layer or layers including the above inorganic insulating material.

A first connection electrode 134, a second connection electrode 136, and a data line DL may be arranged above the interlayer insulating layer 114. The first connection electrode 134 may be electrically connected to the source area S1 of the first transistor TFT1 through a contact hole penetrating the interlayer insulating layer 114. The first connection electrode 134 may be electrically connected to the second drain area D2 of the second transistor TFT2 through the contact hole penetrating the interlayer insulating layer 114. The first connection electrode 134 may be electrically connected to the second electrode C12 of the first capacitor C1 and the first lower gate electrode G12 of the first transistor TFT1 through a contact hole penetrating the interlayer insulating layer 114 and the second buffer layer 112. The second connection electrode 136 may be electrically connected to the second source area S2 of the second transistor TFT2 through the contact hole penetrating the interlayer insulating layer 114.

The first connection electrode 134, the second connection electrode 136, and the data line DL may each include a conductive material including Mo, Al, Cu, or Ti and may each be a layer or layers including the above material. For example, the first connection electrode 134, the second connection electrode 136, and the data line DL may each have a multilayered structure of Ti/Al/Ti.

A first organic insulating layer 115 may be arranged to cover the first connection electrode 134, the second connection electrode 136, and the data line DL. The first organic insulating layer 115 may include an organic insulating material. For example, the first organic insulating layer 115 may include organic insulating materials such as a general-purpose polymer such as polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or a combination thereof.

A third connection electrode 141 and the driving power line PL may be disposed above the first organic insulating layer 115. The third connection electrode 141 may be in electrical contact with the second connection electrode 136 through a contact hole penetrating the first organic insulating layer 115. The third connection electrode 141 and the driving power line PL may each include a conductive material including Mo, Al, Cu, Ti, or the like and may each be a layer or layers including the above material. For example, the third connection electrode 141 and the driving power line PL may each have a multilayered structure of Ti/Al/Ti.

FIG. 8 shows that the data line DL and the driving power line PL may be arranged on different layers, but in an embodiment, the data line DL and the driving power line PL may be disposed on a same layer.

A second organic insulating layer 116 may be disposed above the third connection electrode 141 and the driving power line PL. The second organic insulating layer 116 may include an organic insulating material. For example, the second organic insulating layer 116 may include organic insulating materials such as a general-purpose polymer such as PMMA or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or a combination thereof.

The organic light-emitting diode OLED may be disposed above the second organic insulating layer 116. The organic light-emitting diode OLED may include a sub-pixel electrode 210, an intermediate layer 220, and an opposite electrode 230.

The sub-pixel electrode 210 may be disposed above the second organic insulating layer 116. The sub-pixel electrode 210 may be electrically connected to the third connection electrode 141 through the contact hole penetrating the second organic insulating layer 116. The sub-pixel electrode 210 may be electrically connected to the second source area S2 of the second transistor TFT2 through the third connection electrode 141 and the second connection electrode 136.

The sub-pixel electrode 210 may include a reflection layer including silver (Ag), magnesium (Mg), Al, platinum (Pt), palladium (Pd), gold (Au), nickel (Ni), neodymium (Nd), iridium (Ir), chromium (Cr), or a combination thereof. In another example, the sub-pixel electrode 210 may further include a conductive oxide layer on and/or under the reflection layer. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO), or a combination thereof. In an embodiment, the sub-pixel electrode 210 may have a three-layer structure of ITO/Ag/ITO.

A bank layer 119 may be disposed above the sub-pixel electrode 210. In the bank layer 119, an opening 119OP exposing at least a portion of the sub-pixel electrode 210 may be defined. A central portion of the sub-pixel electrode 210 may be exposed through the opening 119OP defined in the bank layer 119. The opening 119OP may define an emission area of light emitted from the organic light-emitting diode OLED.

The bank layer 119 may include an organic insulating material. In an embodiment, the bank layer 119 may include an inorganic insulating material, such as silicon nitride, silicon oxynitride, or silicon oxide. In an embodiment, the bank layer 119 may include an organic insulating material and an inorganic insulating material. In some embodiments, the bank layer 119 may include a light-shielding material and may be black.

A spacer (not shown) may be formed on the bank layer 119. The spacer and the bank layer 119 may be formed together through the same process or independently formed through separate processes.

At least a portion of the intermediate layer 220 may be located in the opening 119OP of the bank layer 119. The intermediate layer 220 may include an emission layer. The emission layer may include an organic material including a fluorescent or phosphorescent material emitting red light, green light, blue light, or white light, or a combination thereof. The emission layer may include a low-molecular-weight or a high-molecular-weight organic material, or a combination thereof, and on and under the emission layer, functional layers such as a hole transport layer (HTL), a hole injection layer (HIL), an electron transport layer (ETL), and an electron injection layer (EIL) may be selectively arranged.

The emission layer may be patterned corresponding to the sub-pixel electrode 210. Various modifications may be made to layers included in the intermediate layer 220 in addition to the emission layer; for example, the layers may be integrated over the sub-pixel electrodes 210.

The opposite electrode 230 may be disposed above the intermediate layer 220. The opposite electrode 230 may include a conductive material having a low work function. For example, the opposite electrode 230 may include a (translucent) transparent layer including Ag, Mg, Al, Pt, Pd, Au, Ni, Nd, Ir, Cr, lithium (Li), calcium (Ca), or an alloy thereof, or a combination thereof. In another example, the opposite electrode 230 may further include a layer including ITO, IZO, ZnO, or $In_2O_3$ on the transparent (or translucent) layer including the above material. In an embodiment, the opposite electrode 230 may entirely cover the display area DA.

Figure 9:
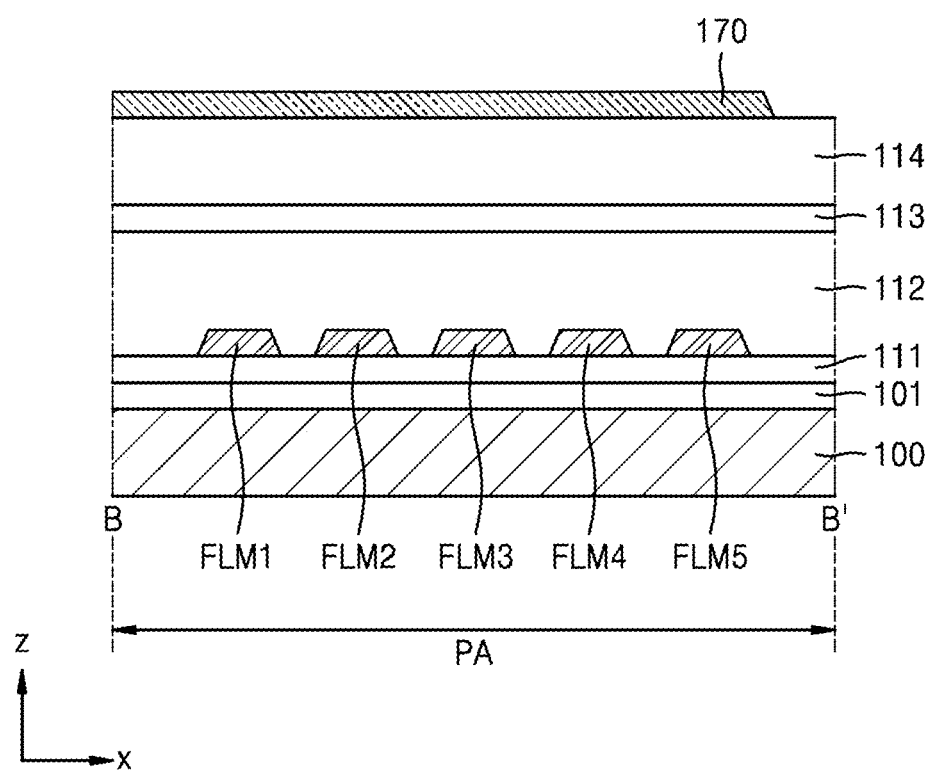
FIG. 9 is a schematic cross-sectional view of a portion of a display apparatus according to an embodiment.
Figure 10:
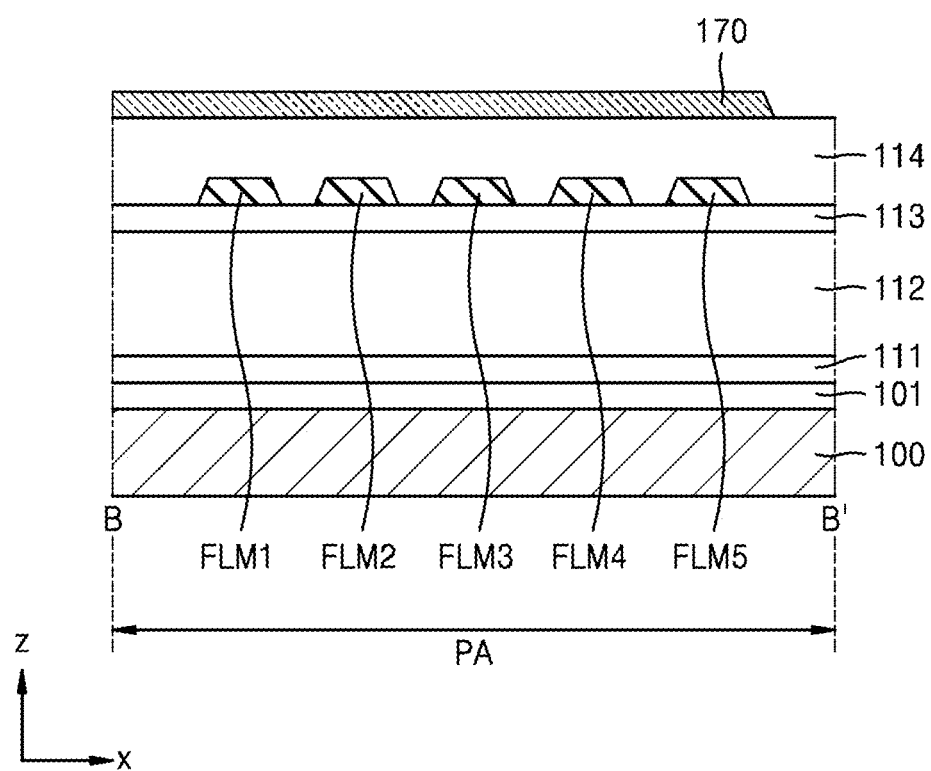
FIG. 10 is a schematic cross-sectional view of a portion of a display apparatus according to an embodiment.

FIGS. 9 and 10 are schematic cross-sectional views of a portion of a display apparatus along line B-B' of FIG. 2, according to an embodiment.

Referring to FIGS. 9 and 10, the display apparatus 1 may include a second power supply line 170 and a start signal line arranged in the peripheral area PA. The start signal line may be provided in the plural. As described above with reference to FIGS. 5 and 6, for example, the start signal line may include a first start signal line FLM1 to a fifth start signal line FLM5 respectively corresponding to a first gate driving circuit 13-1 to a fifth gate driving circuit 13-5. The first start signal line FLM1 to the fifth start signal line FLM5 may be spaced apart from each other and extend in the y direction (the column direction). FIGS. 9 and 10 show that the first start signal line FLM1 to the fifth start signal line FLM5 may be sequentially arranged, but the arrangement order of the first start signal line FLM1 to the fifth start signal line FLM5 may change.

The first start signal line FLM1 to the fifth start signal line FLM5 may overlap the second power supply line 170. The first start signal line FLM1 to the fifth start signal line FLM5 may be arranged between the substrate 100 and the second power supply line 170. That is, the first start signal line FLM1 to the fifth start signal line FLM5 may be arranged on a different layer from the second power supply line 170.

Referring to FIG. 9, in an embodiment, the first through fifth start signal lines FLM1, FLM2, FLM3, FLM4, and FLM5 and the first lower gate electrode G12 of the first transistor TFT1, the second electrode C12 of the first capacitor C1, and the second electrode C22 of the second capacitor C2 which are described above with reference to FIGS. 7 and 8 may be disposed on a same layer (e.g., the first buffer layer 111). The first through fifth start signal lines FLM1, FLM2, FLM3, FLM4, and FLM5 and the first lower gate electrode G12 of the first transistor TFT1, the second electrode C12 of the first capacitor C1, and the second electrode C22 of the second capacitor C2 which are described above with reference to FIGS. 7 and 8 may include a same material. The first start signal line FLM1 to the fifth start signal line FLM5 may each include Mo, Al, Cu, Ti, or the like and may each be a layer or layers. For example, each of the first start signal line FLM1 to the fifth start signal line FLM5 may be a single Al layer.

Referring to FIG. 10, in an embodiment, the first through fifth start signal lines FLM1, FLM2, FLM3, FLM4, and FLM5 and the first gate electrode G11 of the first transistor TFT1, the first electrode C11 of the first capacitor C1, and the second gate electrode G2 of the second transistor TFT2 which are described above with reference to FIGS. 7 and 8 may be disposed on a same layer (e.g., the gate insulating layer 113). The first through fifth start signal lines FLM1, FLM2, FLM3, FLM4, and FLM5 and the first gate electrode G11 of the first transistor TFT1, the first electrode C11 of the first capacitor C1, and the second gate electrode G2 of the second transistor TFT2 which are described above with reference to FIGS. 7 and 8 may include a same material. The first start signal line FLM1 to the fifth start signal line FLM5 may each include Mo, Al, Cu, Ti, or the like or a combination thereof and may each be a layer or layers. For example, each of the first start signal line FLM1 to the fifth start signal line FLM5 may be a single Mo layer.

In the Comparative Example, in case that a first start signal line to a fifth start signal line and a second power supply line are arranged on a same layer, or in case that some or all of the first start signal line to the fifth start signal line do not overlap the second power supply line, some or all of the first start signal line to the fifth start signal line may be arranged between the second power supply line and a gate driving circuit in a plan view. Therefore, because a separate space is required in a peripheral area to arrange the first start signal line to the fifth start signal line in a plan view, the area of the gate driving circuit and the width of the second power supply line are relatively limited, and a dead space in a display apparatus may increase. Herein, the term "dead space" may be understood as a space which is devoted to accommodating one or more components that, either singularly or plurally, perform an intended function.

However, according to an embodiment, because the first start signal line FLM1 to the fifth start signal line FLM5 overlap the second power supply line 170 in a plan view and may be arranged between the substrate 100 and the second power supply line 170, a separate space for the first start signal line FLM1 to the fifth start signal line FLM5 in a plan view may not be required. Therefore, the width of the second power supply line 170 may increase, and an area for outputting the gate driving circuit (13 of FIG. 2) may be secured. Moreover, the area of the dead space in the display apparatus 1 may be reduced.

FIGS. 9 and 10 show that the first start signal line FLM1 to the fifth start signal line FLM5 overlap the second power supply line 170, but one or more embodiments are not limited thereto. In an embodiment, the first start signal line FLM1 to the fifth start signal line FLM5 may overlap the first power supply line 160 configured to apply the driving voltage ELVDD in a plan view. The first start signal line FLM1 to the fifth start signal line FLM5 may be arranged between the first power supply lines 160.

According to the one or more embodiments, a display apparatus with a reduced dead space may be realized. However, the scope of the disclosure is not limited by the effects.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display apparatus comprising:
   a display area and a peripheral area outside the display area;
   a power supply line arranged in the peripheral area;
   a gate driving circuit arranged above a substrate between the power supply line and the display area and comprising a plurality of stages arranged in a direction; and
   a signal line arranged in the peripheral area, electrically connected to a first stage from among the plurality of stages of the gate driving circuit, and configured to transmit a start signal,
   wherein the signal line overlaps the power supply line in a plan view and is disposed on a different layer from the power supply line between the substrate and the power supply line.

2. The display apparatus of claim 1, wherein the plurality of stages are configured to sequentially output gate signals based on the start signal or an output signal of a previous stage.

3. The display apparatus of claim 1, further comprising:
   a light-emitting diode arranged in the display area; and
   a sub-pixel circuit arranged between the substrate and the light-emitting diode,
   wherein the sub-pixel circuit comprises:
   a transistor comprising a semiconductor layer and a gate electrode disposed above the semiconductor layer and overlapping at least a portion of the semiconductor layer in a plan view; and
   a capacitor comprising a first electrode and a second electrode disposed under the first electrode and overlapping the first electrode in a plan view.

4. The display apparatus of claim 3, further comprising:
   a connection electrode electrically connecting the light-emitting diode to the sub-pixel circuit,
   wherein the power supply line and the connection electrode comprise a same material.

5. The display apparatus of claim 3, wherein the signal line and the gate electrode comprise a same material.

6. The display apparatus of claim 3, wherein the transistor further comprises:
   a lower gate electrode arranged between the substrate and the semiconductor layer and overlapping the gate electrode in a plan view.

7. The display apparatus of claim 6, wherein the signal line and the lower gate electrode comprise a same material.

8. The display apparatus of claim 6, wherein the capacitor further comprises:
   a third electrode disposed under the second electrode and overlapping the first electrode and the second electrode in a plan view, wherein
   the first electrode is electrically connected to the third electrode, and
   the second electrode and the lower gate electrode comprise a same material.

9. The display apparatus of claim 3, wherein the semiconductor layer comprises an oxide semiconductor.

10. The display apparatus of claim 3, wherein
    the light-emitting diode comprises a sub-pixel electrode and an opposite electrode, and
    the power supply line is configured to supply a common voltage to the opposite electrode.

11. The display apparatus of claim 1, further comprising:
    a plurality of sub-pixels arranged in the display area,
    wherein each of the plurality of sub-pixels comprises:
    a first transistor comprising a first terminal, a second terminal, a first gate electrode, and a second gate electrode electrically connected to the second terminal;
    a second transistor electrically connected to the first gate electrode of the first transistor and a data line;
    a third transistor electrically connected to the first gate electrode of the first transistor and a first voltage line;
    a fourth transistor electrically connected to the second terminal of the first transistor and a second voltage line;

a fifth transistor electrically connected to the second terminal of the first transistor and a third voltage line;

a first capacitor comprising a first electrode electrically connected to the first gate electrode of the first transistor and a second electrode electrically connected to the second terminal of the first transistor; and a second capacitor comprising a first electrode electrically connected to the third voltage line and a second electrode electrically connected to the second terminal of the first transistor.

12. The display apparatus of claim 11, further comprising:

a sixth transistor electrically connected to the second terminal of the first transistor and a light-emitting diode; and a seventh transistor electrically connected to the light-emitting diode and a fourth voltage line.

13. A display apparatus comprising:

a substrate comprising a display area and a peripheral area outside the display area;

a power supply line arranged in the peripheral area and extending in a first direction;

a plurality of gate driving circuits arranged between the power supply line and the display area and each comprising a plurality of stages arranged in the first direction; and a plurality of signal lines arranged in the peripheral area, electrically connected to a first stage from among the plurality of stages of each of the plurality of gate driving circuits, and configured to transmit start signals, wherein the plurality of signal lines overlap the power supply line in a plan view and are disposed on a different layer from the power supply line between the substrate and the power supply line.

14. The display apparatus of claim 13, wherein the plurality of stages are configured to sequentially output gate signals based on the start signals or an output signal of a previous stage.

15. A display apparatus comprising:

a substrate comprising a display area and a peripheral area outside the display area;

a power supply line arranged in the peripheral area and extending in a first direction;

a plurality of gate driving circuits arranged between the power supply line and the display area and each comprising a plurality of stages arranged in the first direction; and a plurality of signal lines arranged in the peripheral area, electrically connected to a first stage from among the plurality of stages of each of the plurality of gate driving circuits, and configured to transmit start signals, wherein the plurality of signal lines overlap the power supply line in a plan view and are arranged between the substrate and the power supply line;

a light-emitting diode arranged in the display area; and a sub-pixel circuit arranged between the substrate and the light-emitting diode, wherein the sub-pixel circuit comprises:

a transistor comprising a semiconductor layer and a gate electrode disposed above the semiconductor layer and overlapping at least a portion of the semiconductor layer in a plan view; and a capacitor comprising a first electrode and a second electrode disposed under the first electrode and overlapping the first electrode in a plan view.

16. The display apparatus of claim 15, further comprising:

a connection electrode electrically connecting the light-emitting diode to the sub-pixel circuit, wherein the power supply line and the connection electrode comprise a same material.

17. The display apparatus of claim 15, wherein the plurality of signal lines and the gate electrode comprise a same material.

18. The display apparatus of claim 15, wherein the transistor further comprises a lower gate electrode arranged between the substrate and the semiconductor layer and overlapping the gate electrode in a plan view.

19. The display apparatus of claim 18, wherein the plurality of signal lines and the lower gate electrode comprise a same material.

20. The display apparatus of claim 18, wherein the capacitor further comprises a third electrode disposed under the second electrode and overlapping the first electrode and the second electrode in a plan view, the first electrode is electrically connected to the third electrode, and the second electrode and the lower gate electrode comprise a same material.

* * * * *